United States Patent
Fallon et al.

(10) Patent No.: US 10,011,436 B2
(45) Date of Patent: Jul. 3, 2018

(54) FEED UNIT

(71) Applicant: British American Tobacco (Investments) Limited, London (GB)

(72) Inventors: Gary Fallon, London (GB); Kie Seon Park, London (GB); Martin Fuller, Warwickshire (GB); Geoffrey Vernon, Warwickshire (GB); Andrew Cleall, Warwickshire (GB); James Stembridge, Warwickshire (GB); Thomas Grunfeld, Warwickshire (GB)

(73) Assignee: BRITISH AMERICAN TOBACCO (INVESTMENTS) LIMITED, London (GB)

( * ) Notice: Subject to any disclaimer, the term of this patent is extended or adjusted under 35 U.S.C. 154(b) by 0 days.

(21) Appl. No.: 15/128,643

(22) PCT Filed: Mar. 18, 2015

(86) PCT No.: PCT/EP2015/055649
§ 371 (c)(1),
(2) Date: Sep. 23, 2016

(87) PCT Pub. No.: WO2015/144515
PCT Pub. Date: Oct. 1, 2015

(65) Prior Publication Data
US 2017/0107060 A1    Apr. 20, 2017

(30) Foreign Application Priority Data
Mar. 25, 2014 (GB) .................................. 1405340.9

(51) Int. Cl.
*B65G 47/14* (2006.01)
*B65G 47/88* (2006.01)

(52) U.S. Cl.
CPC ....... *B65G 47/145* (2013.01); *B65G 47/8876* (2013.01)

(58) Field of Classification Search
CPC ... B65G 47/14; B65G 47/145; B65G 47/8876
(Continued)

(56) References Cited

U.S. PATENT DOCUMENTS

| 976,540 A | 11/1910 | Bergner |
| 2,168,191 A | 8/1939 | Bergmann |

(Continued)

FOREIGN PATENT DOCUMENTS

| CN | 86203433 U | 3/1987 |
| DE | 2141135 A1 | 3/1972 |

(Continued)

OTHER PUBLICATIONS

International Preliminary Report on Patentability for corresponding application PCT/EP2015/055705 filed on Mar. 18, 2015; dated Jun. 13, 2016.
(Continued)

*Primary Examiner* — Douglas Hess
(74) *Attorney, Agent, or Firm* — Cantor Colburn LLP

(57) ABSTRACT

A feed unit, for example for feeding components to smoking article assembly apparatus. The feed unit has a rotary device having a supply region (4) and one or more channels (7) adapted to receive components from the supply region (4) such that the components are stacked one on top of another within each channel (7). Each channel (7) has an inlet (5) and an outlet through which components pass for output from the feed unit. One of the inlet (5) and the supply region (4) is configured to reciprocate relative to the other to agitate the components in the supply region (4) so that components pass into the channel (7).

20 Claims, 23 Drawing Sheets

(58) Field of Classification Search
USPC .............. 198/389, 391, 396, 397.01, 397.02, 198/397.05
See application file for complete search history.

(56) References Cited

U.S. PATENT DOCUMENTS

| | | | |
|---|---|---|---|
| 3,036,581 A | 5/1962 | Dearsley | |
| 3,417,856 A * | 12/1968 | O'Brien | H05K 13/028 198/380 |
| 3,552,545 A | 1/1971 | Hartman | |
| 3,613,861 A * | 10/1971 | Whitecar | B65G 47/1457 198/392 |
| 2,273,509 A | 2/1972 | Braren | |
| 3,643,669 A | 2/1972 | Korber | |
| 3,722,740 A | 3/1973 | List | |
| 3,782,526 A | 1/1974 | Simons | |
| 3,817,423 A | 6/1974 | McKnight | |
| 3,823,803 A | 7/1974 | Lubin | |
| 3,938,698 A | 2/1976 | McDavid | |
| 3,942,645 A | 3/1976 | Aronson | |
| 4,174,775 A | 11/1979 | McKnight et al. | |
| 4,201,313 A * | 5/1980 | Kirsch | B65G 47/1407 198/389 |
| 4,281,758 A | 8/1981 | Adamski | |
| 4,763,775 A | 8/1988 | Jefferys | |
| 5,318,201 A | 6/1994 | Lowe | |
| 5,549,189 A | 8/1996 | Martisala | |
| 5,636,725 A * | 6/1997 | Saito | B65G 47/145 198/383 |
| 5,826,696 A | 10/1998 | Rupp | |
| 6,032,783 A * | 3/2000 | Saito | H05K 13/022 193/44 |
| 6,109,420 A | 8/2000 | Poppi | |
| 6,116,407 A | 9/2000 | Zolicoffer | |
| 6,135,264 A * | 10/2000 | Saito | H05K 13/028 198/383 |
| 6,234,298 B1 | 5/2001 | Nakagawa et al. | |
| 6,405,895 B1 * | 6/2002 | Kondo | H05K 13/028 198/396 |
| 6,443,669 B2 * | 9/2002 | Saito | H05K 13/021 198/390 |
| 6,619,467 B1 * | 9/2003 | Nakagawa | H05K 13/028 198/390 |
| 6,899,780 B2 | 5/2005 | Rajala | |
| 6,942,645 B2 | 9/2005 | Alexandre et al. | |
| 7,240,782 B2 * | 7/2007 | Weber | B21J 15/32 198/396 |
| 2008/0296127 A1 | 12/2008 | Mercade et al. | |
| 2009/0120765 A1 | 5/2009 | Sala | |
| 2009/0210765 A1 | 8/2009 | Henocq et al. | |
| 2009/0283384 A1 | 11/2009 | Sala et al. | |
| 2011/0180373 A1 | 7/2011 | Broers | |
| 2017/0107061 A1 | 4/2017 | Fallon et al. | |
| 2017/0107062 A1 | 4/2017 | Fallon et al. | |
| 2017/0113881 A1 | 4/2017 | Fallon et al. | |

FOREIGN PATENT DOCUMENTS

| | | |
|---|---|---|
| EP | 0684194 A1 | 11/1995 |
| EP | 1380521 A1 | 1/2004 |
| EP | 2658800 B1 | 11/2014 |
| FR | 2915191 A1 | 10/2008 |
| GB | 471521 | 9/1937 |
| GB | 782792 | 9/1957 |
| GB | 1024730 A | 4/1966 |
| GB | 1389447 | 4/1975 |
| JP | 5434233 B2 | 10/1979 |
| JP | 01094313 U1 | 6/1989 |
| JP | 04117836 U1 | 10/1992 |
| JP | 08048419 A | 2/1996 |
| JP | 10181868 A | 7/1998 |
| JP | 11238998 A | 8/1999 |
| JP | 2000156598 A | 6/2000 |
| JP | 2002154637 A | 5/2002 |
| JP | 2009266454 A | 11/2009 |
| LU | 44414 A | 9/1964 |
| NL | 6610123 A | 10/1967 |
| WO | 2009071272 A1 | 6/2009 |
| WO | 2010142498 A1 | 12/2010 |
| WO | 2012072676 A1 | 6/2012 |
| WO | 2012138241 A1 | 10/2012 |

OTHER PUBLICATIONS

International Search Report for corresponding application PCT/EP2015/055635 filed Mar. 18, 2015; dated Jun. 8, 2015.
International Search Report for corresponding application PCT/EP2015/055649 filed Mar. 18, 2015; dated Jun. 9, 2015.
International Search Report for corresponding application PCT/EP2015/055694 filed Mar. 18, 2015; dated Jun. 9, 2015.
International Search Report for corresponding application PCT/EP2015/055705 filed on Mar. 18, 2015; dated Jun. 19, 2015.
Response to International Search Report and Written Opinion for corresponding application PCT/EP2015/055649 filed Mar. 18, 2015; Report dated Sep. 24, 2015.
Response to International Search Report and Written Opinion for corresponding application PCT/EP2015/055705 filed on Mar. 18, 2015; dated Oct. 28, 2015.
Response to the International Search Report and Written Opinion for corresponding Application No. PCT/EP2015/055635; Report dated Sep. 23, 2015.
Response to Written Opinion of the International Preliminary Examining Authority for corresponding application PCT/EP2015/055694 filed Mar. 18, 2015; dated Apr. 21, 2016.
Written Opinion of the International Searching Authority for corresponding application PCT/EP2015/055635 filed Mar. 18, 2015; dated Jun. 8, 2015.
Written Opinion of the International Searching Authority for corresponding application PCT/EP2015/055649 filed Mar. 18, 2015; dated Jun. 9, 2015.
Written Opinion of the International Searching Authority for corresponding application PCT/EP2015/055694 filed Mar. 18, 2015; dated Jun. 9, 2015.
Written Opinion of the International Searching Authority for corresponding application PCT/EP2015/055705 filed on Mar. 18, 2015; dated Jun. 19, 2015.
Written Opinion of the International Preliminary Examining Authority for corresponding Application No. PCT/EP2015/055635 filed Mar. 18, 2015; dated Mar. 3, 2016.
Written Opinion of the International Preliminary Examining Authority for corresponding application PCT/EP2015/055649 filed Mar. 18, 2015; Report dated Sep. 3, 2016.
Written Opinion of the International Preliminary Examining Authority for corresponding application PCT/EP2015/055694 filed Mar. 18, 2015; dated Mar. 9, 2016.
Written Opinion of the International Preliminary Examining Authority for corresponding application PCT/EP2015/055705 filed on Mar. 18, 2015; dated Mar. 9, 2016.
International Preliminary Report on Patentability dated Oct. 10, 2016 re: Application No. PCT/GB2015/051416; pp. 1-5; citing: U.S. Pat. No. 3,348,552 A, U.S. Pat. No. 4,334,449 A.

* cited by examiner

FEED UNIT

TECHNICAL FIELD

The invention relates to a feed unit for feeding components to subsequent apparatus.

BACKGROUND

Some smoking articles have filters which include multiple components. For example, a filter may be provided with components that can rotate relative to each other to adjust ventilation or other characteristics. Such components may have an asymmetrical shape and need to be provided with a particular orientation prior to being fed into assembly apparatus where they are combined with other components of a smoking article, such as a tobacco rod and wrapper.

A vibratory bowl feeder can be used to feed such components into an assembly line. Vibratory bowl feeders have a vibrating bowl and track along which components travel as the track vibrates. Components having an incorrect orientation are ejected back into the bowl as they travel along the track, providing a stream of components with uniform orientation.

SUMMARY

According to the present invention, there is provided a feed unit comprising:
  a rotary device having a supply region and one or more channels adapted to receive components from the supply region such that the components are stacked one on top of another within each channel;
  wherein each channel has an inlet and an outlet through which components pass for output from the feed unit; and,
  wherein one of the inlet and the supply region is configured to reciprocate relative to the other to agitate the components in the supply region so that components pass into the channel.

Each inlet may be configured to reciprocate relative to the supply region.

Each inlet may be configured to reciprocate relative to the supply region and the corresponding outlet.

The feed may comprise protrusions arranged to slide relative to each other to permit each inlet to reciprocate relative to each outlet.

The protrusions may overlap and may be arranged to maintain the cross-sectional shape of each channel during reciprocation of the inlet relative to the outlet.

The feed unit may further comprise a cam track to cause reciprocation of each inlet as the rotary device rotates.

The cam track may be configured to cause each inlet to move towards the supply region at a lower speed than each inlet moves away from the supply region.

Each inlet may comprise a funnel-shaped opening.

The distance between opposing sides of each opening may be less than a length of said component.

Each inlet may comprise a wall that divides that inlet from an adjacent inlet, and the wall may extend into the supply region.

The supply region may comprise walls inclined towards each inlet.

The feed unit may further comprise a guide member that defines a path along which components are pushed for output from the feed unit after passing through a channel.

According to another aspect of the present invention, there is provided a method of feeding components to assembly apparatus, comprising supplying components to a supply region of a rotary device having one or more channels with an inlet, and reciprocating one of the inlet or the supply region relative to the other to agitate components in the supply region such that components pass into channels and are stacked one on top of another within each channel before passing through outlets for output to said assembly apparatus.

According to further aspect of the present invention, there is provided a method of assembling an article, comprising the method of feeding components to assembly apparatus described above and further comprising combining each of said components with one or more further components to form an article.

According a further aspect of the invention, there is provided an article assembled using the method of assembling an article described above.

BRIEF DESCRIPTION OF THE FIGURES

In order that the invention may be more fully understood, embodiments thereof will now be described by way of example only, with reference to the accompanying Figures, in which.

DETAILED DESCRIPTION

Figure 1:
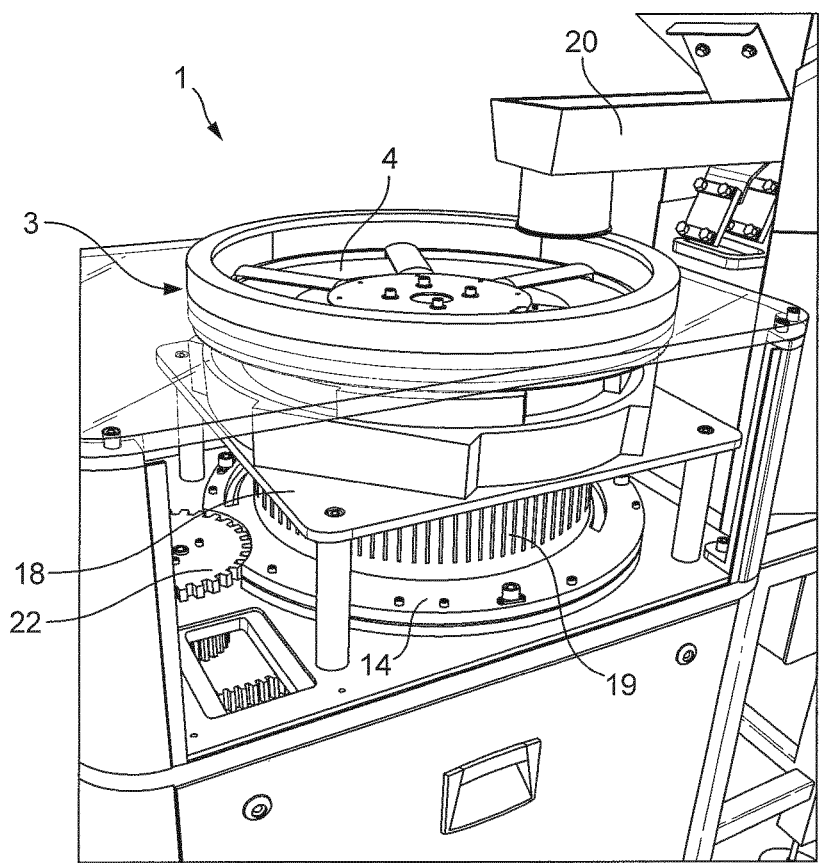
FIG. 1 shows a feed unit 1.

FIG. 1 shows a feed unit 1 that has a rotary device 3 mounted to a frame 18. The rotary device 3 includes a drum 19 with a supply region 4 and a conveyor 20, for example a belt conveyor, a linear vibratory conveyor or other type of conveyor. In this example the supply region is a hopper 4 with inclined sides but it may be any space that can receive a plurality of components. The conveyor 20 supplies the hopper 4 with components and the hopper 4 may also have a level sensor, for example an optical sensor, which monitors the amount of components in the hopper 4 to determine when the conveyor 20 should provide more components to the hopper 4. In this way, when the hopper 4 is full the conveyor 20 can be turned off and when the level of components in the hopper 4 drops the conveyor 20 can be turned on.

The rotary device 3 is rotatably mounted to a frame 18 and is driven to rotate about a substantially vertical axis by a drive means, for example a motor and toothed belt or gear arrangement.

Components received in the hopper 4 pass into channels (7, see FIG. 4) extending from the bottom of the hopper 4 and are stacked one on top of another within the channels. The channels are formed in the drum 19 and so rotate together with the hopper 4. From the channels the components are dispensed into a track 14, disposed below the drum 19, which is stationary relative to the drum 19. The track 14 defines a path through the feed unit 1 along which the components travel for output from the feed unit 1. A plurality of pushers (21, see FIG. 13) on the drum 19 act to push the components along the track 14 to a transfer drum 22 that transfers the components to subsequent apparatus. As the components are pushed along the track 14 they are sorted and orientated to produce an output of components having uniform orientation.

Figure 2:
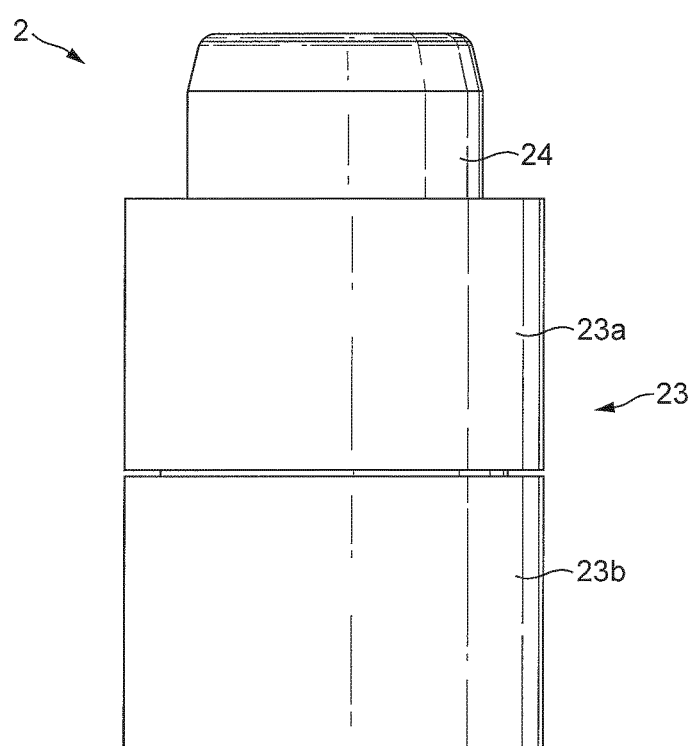
FIG. 2 shows a filter component 2 for a smoking article.

As explained herein, the feed unit 1 shown in FIG. 1 provides a stream of uniformly orientated components that can be transferred to subsequent machinery. In one example, the components are rigid polymer filter components and pass from the feed unit 1 into smoking article assembly apparatus where they are combined with further filter components, such as an acetate filter rod, and a tobacco rod before being wrapped and cut to form smoking articles. FIG. 2 shows an example of such a filter component 2. The component has a cylindrical body 23 and a protrusion 24 extending from one end of the cylindrical body 23. The protrusion 24 is also cylindrical and positioned centrally on the end of the body 23. In this example, the body 23 of the filter component has two parts 23a, 23b that are rotatable relative to each other to provide the assembled smoking article with adjustable ventilation.

Figure 3:
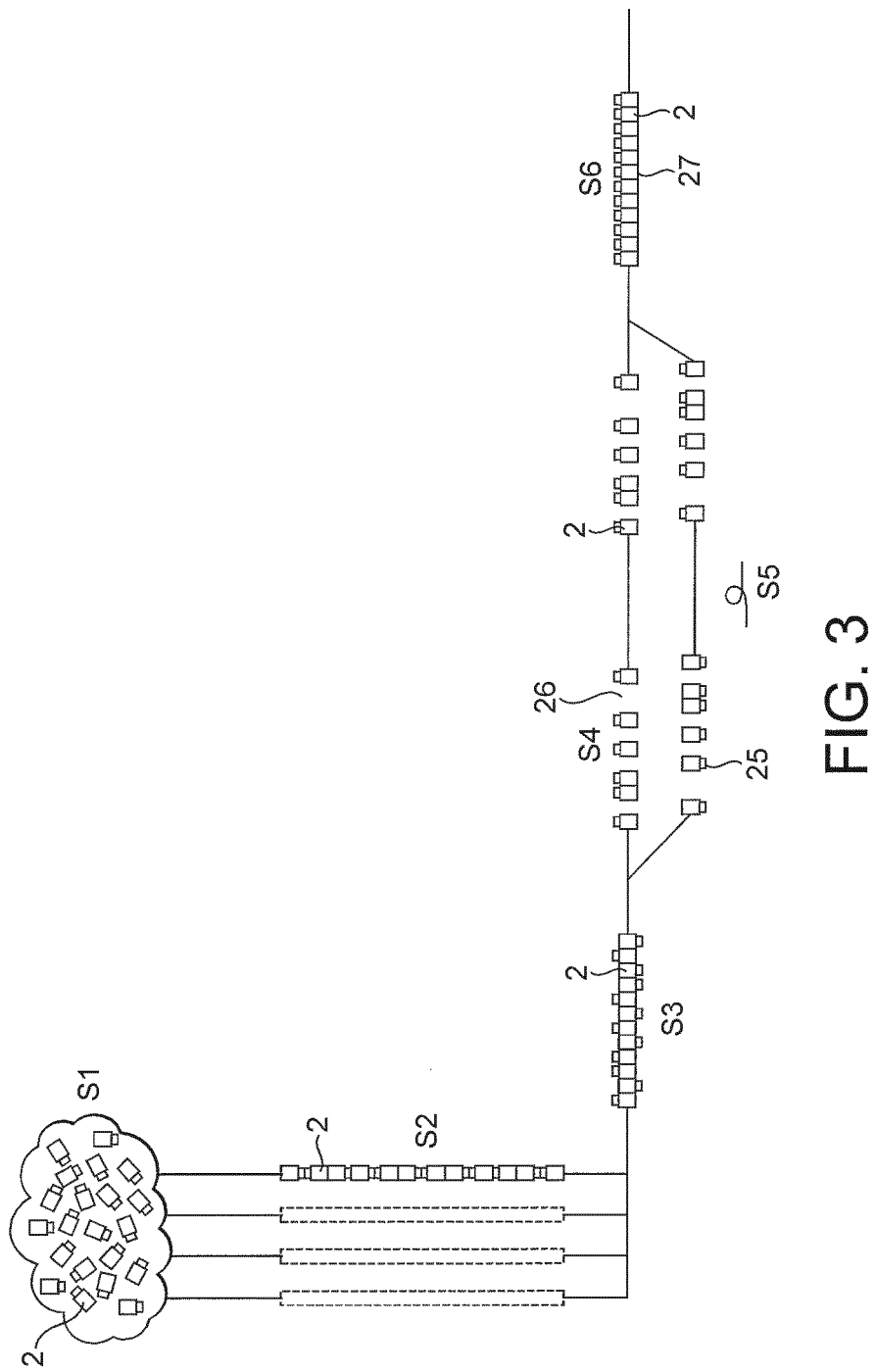
FIG. 3 shows a schematic diagram of the process performed by the feed unit.

FIG. 3 shows a schematic diagram of the actions performed by the feed unit to feed a stream of the components 2 shown in FIG. 2 to smoking article assembly apparatus. The steps of FIG. 3 are explained below:

S1 The components are provided to the feed unit as a group of unaligned, randomly orientated components.

S2 The feed unit aligns the components 2 axially into substantially vertical stacks of components in end-to-end alignment where the components may be orientated with the protrusion (24, see FIG. 2) facing upwards or downwards.

S3 The feed unit moves the components 2, one-by-one, in a direction transverse to the stacks (i.e. in a substantially horizontal direction) to form a stream of components moving along a path, with each protrusion (24, see FIG. 2) directed either upwards or downwards.

S4 As the components 2 travel along the path they are divided into first and second streams 25, 26 according to their orientation.

S5 The first stream, in this case the stream with downwardly directed protrusions, is rotated such that the orientation of all components 2 is the same.

S6 The two streams 25, 26 of uniformly orientated components 2 are then recombined to create a single stream 27 of uniformly orientated components 2 for transfer to smoking article assembly apparatus.

Figure 4:
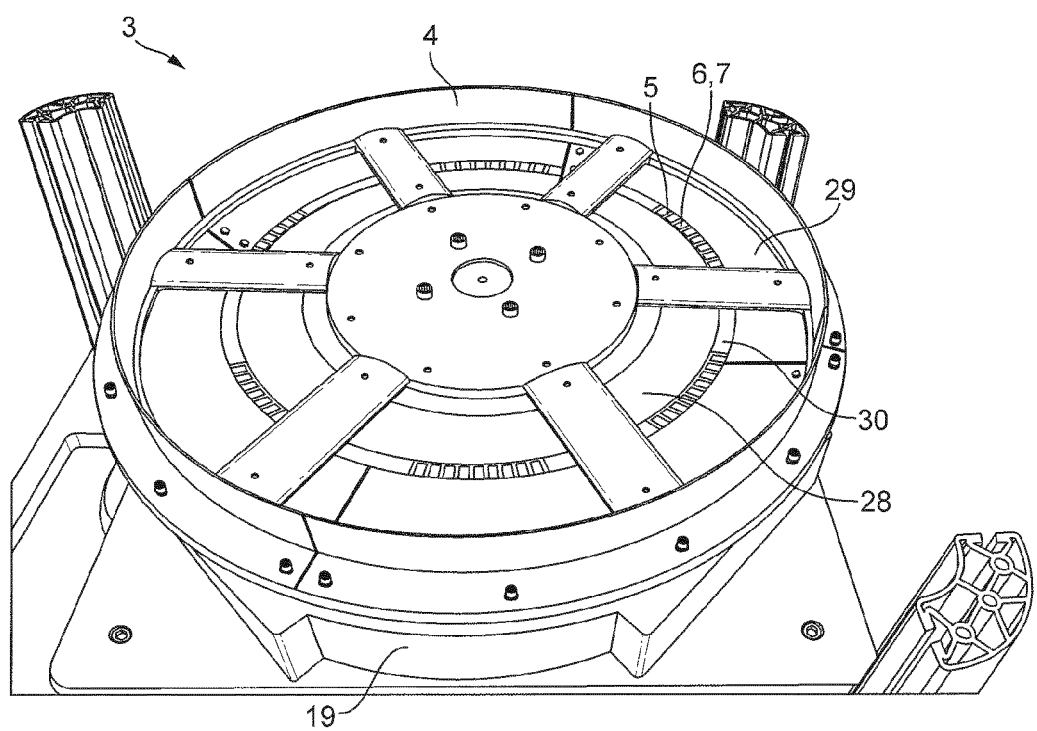
FIG. 4 shows the rotary device 3 of the feed unit, including a hopper 4, inlets 5 and openings 6 into channels 7.

The hopper 4 shown in FIG. 1 receives the unaligned, randomly orientated components from the conveyor (20, see FIG. 1), as per step S1 shown in FIG. 3. As illustrated in FIG. 4, a series of channels 7 having inlets 5 are disposed at the bottom of the hopper 4 and each inlet 5 has an opening 6 into the channel 7 which extends downwards such that components pass into the channels and are stacked one on top of another in axial alignment, with the protrusions (24 see FIG. 2) directed either upwardly or downwardly, as per step S2 shown in FIG. 3. The channels 7 have a circular cross-sectional shape so that the channels 7 retain the cylindrical components in axial alignment.

The hopper 4 includes an inner side wall 28 and an outer side wall 29 which are inclined towards an annular space 30 formed in the hopper 4 in which the inlets 5 of the channels 7 are disposed. Therefore, components placed in the hopper 4 are directed towards the inlets 5 by the inner and outer inclined walls 28, 29 and pass into the channels 7 through the openings 6 of the inlets 5. Inlets 5 may be arranged adjacent to one another all the way around the annular space 30. Alternatively, spaces may be formed between adjacent inlets 5.

Figure 5A:
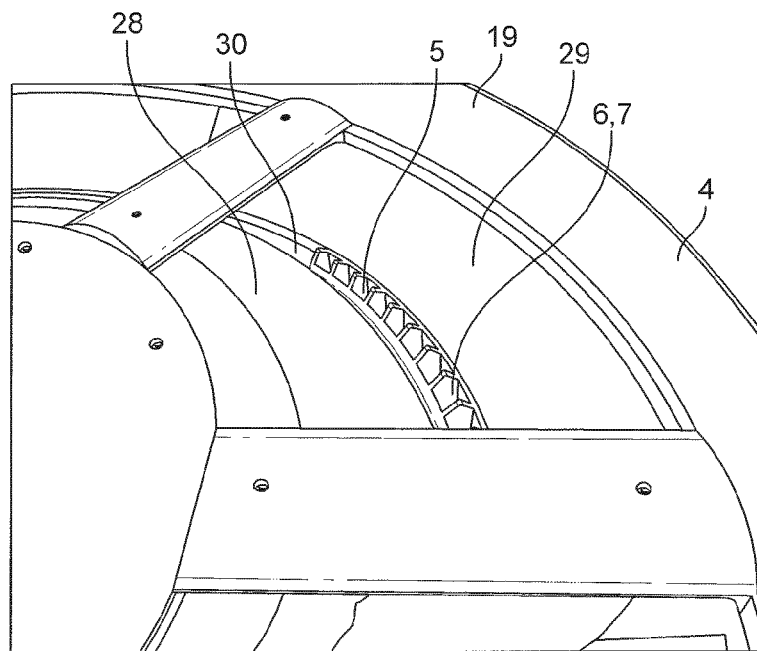
FIGS. 5a and 5b show the hopper 4 of the feed unit, with the inlets 5 in retracted and raised positions respectively.
Figure 5B:
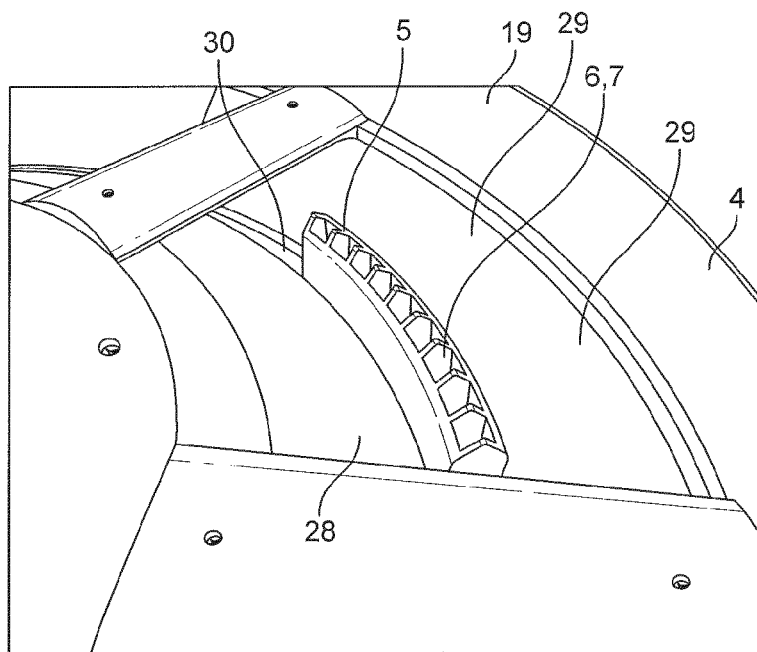

Each inlet 5 is grouped with adjacent inlets 5 and, as the drum 19 rotates, the groups of inlets 5 are arranged to reciprocate between the positions shown in FIGS. 5a and 5b. That is, the inlets 5 of the channels 7, including the openings 6 into each channel 7, reciprocate up and down relative to the hopper 4 as the drum 19, hopper 4 and channels 7 rotate. This reciprocating movement agitates the components in the hopper 4, preventing the components from jamming or blocking the openings 6 and causes the components to enter through the openings 6, into the channels 7.

FIG. 5a shows the inlets 5 in a retracted position where the openings 6 are approximately level with the annular space 30 formed between the inner and outer inclined walls 28, 29 of the hopper 4. FIG. 5b shows the inlets 5 in a raised position, where the inlets 5 have moved into the hopper 4, displacing, mixing and agitating the components within the hopper 4 and causing components to enter through the openings 6 into the channels 7. It will be appreciated that the inlets 5 may be configured to reciprocate between different retracted and raised positions. For example, in the retracted position the openings 6 may be below the annular space 30, for example by 10 mm or 20 mm, level with the annular space 30, or slightly above the annular space 30. Also, in the raised position the distance between the opening 6 and the annular space 30 may be up to 50 mm, for example between 5 mm and 30 mm.

Figure 6A:
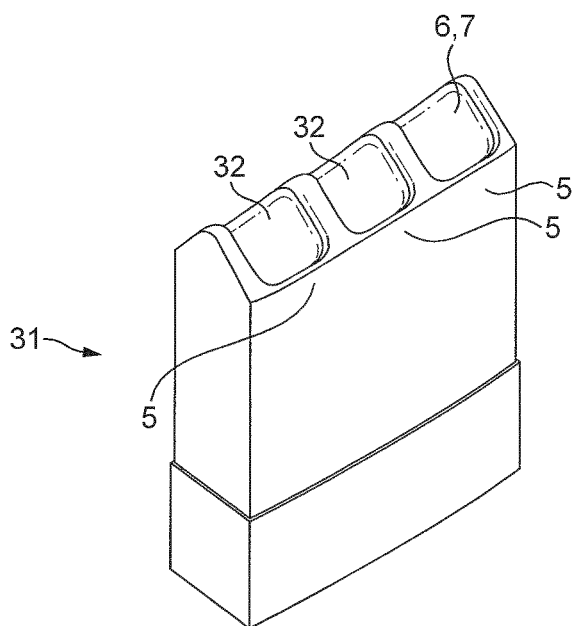
FIG. 6a shows a group of inlets 5.

FIG. 6a shows one group of inlets 5. In this example, three inlets 5 have been grouped together in a single part 31, for example a polymer moulding, which reciprocates relative to the hopper. Also shown in FIG. 6a, the opening 6 of each channel 7 formed in the inlet 5 is funnel-shaped and substantially square. This is shown more clearly in FIG. 6b, which shows a cross-section of an inlet 5 of one channel 7 disposed in the hopper 4. As shown, the circular channel 7 expands in a funnel shape towards the opening 6 in the inlet 5.

The channel 7 itself is circular to receive the components, but the opening 6 is substantially square shaped to maximise the size of the opening 6 and thereby ease the passage of components into the channels 7 from the hopper 4. Therefore, within the inlet 5 the circular channel 7 expands to form a tapered opening 6 having a square cross-section through which components can easily pass into the channels 7 without becoming jammed or blocking the opening 6. In particular, the square-tapered opening 6 of each channel 7 is sized such that a component cannot stably bridge the opening 6 and cause a blockage in the inlet 5. Therefore, irrespective of the orientation of the component, it can pass through the opening and into a channel 7.

In an alternative example the openings 6 in the inlets 5 may comprise a funnel having a circular cross-section.

Figure 6B:
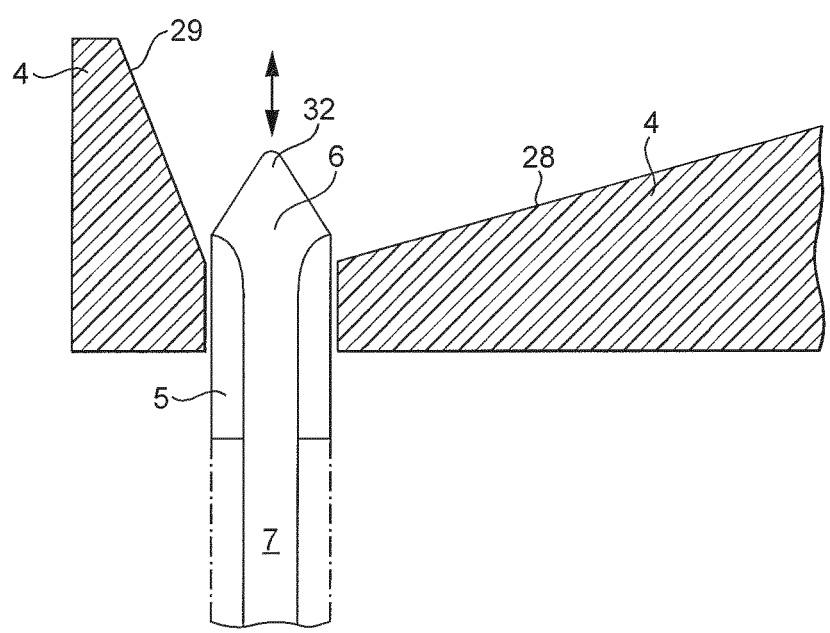
FIG. 6b shows a cross-section of an inlet 5 and the hopper 4.

The shape, angle and proximity of the inclined inner and outer walls 28, 29 of the hopper 4 in the vicinity of the reciprocating inlets 5 further prevents components from becoming jammed or from blocking the openings 6. As shown in FIG. 6b, as the inlets 5 reciprocate any components overhanging an opening 6 or resting on opposing sides of an inlet 5 will be knocked into the opening 6 by one of the inner and outer inclined walls 28, 29 of the hopper 4 as that inlet 5 reciprocates.

Furthermore, the walls 32 that divide each opening 6 from an adjacent opening 6 are pitched or pointed, which acts to move and turn the components as the inlets 5 reciprocate to prevent components becoming jammed in the openings 6 and to rotate at least some components towards axial alignment with the channels 7 such that they more easily enter through an opening 6 and pass into a channel 7.

Figure 7A:
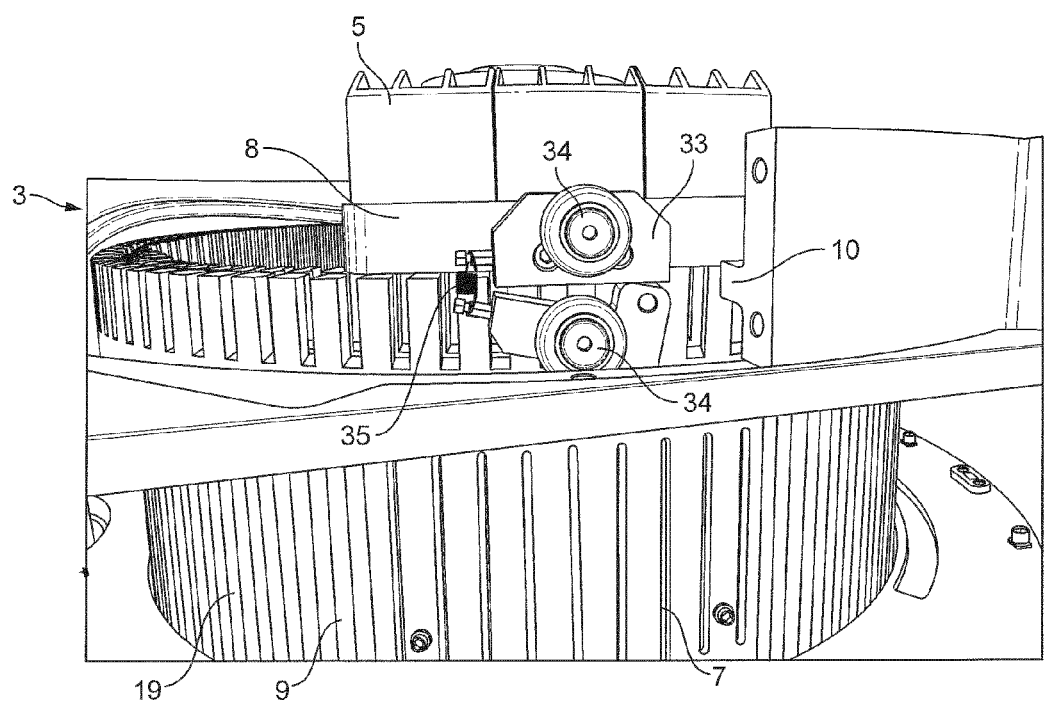
FIG. 7a shows the rotary device 3 with an outer cover removed, such that the carriers 8, on which the inlets 5 are mounted, and the lower portions 9 of the channels 7 are visible.
Figure 7B:
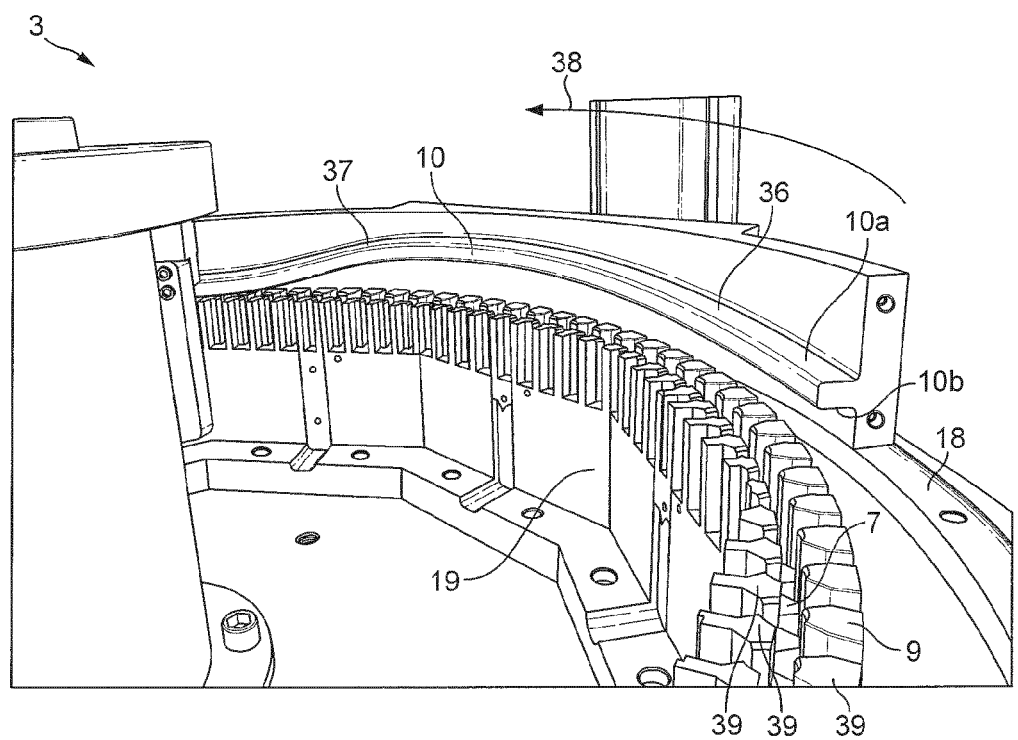
FIG. 7b shows the rotary device 3 with the hopper removed, such that the lower portions 9 of the channels 7 and the cam track to are visible.
Figure 7C:
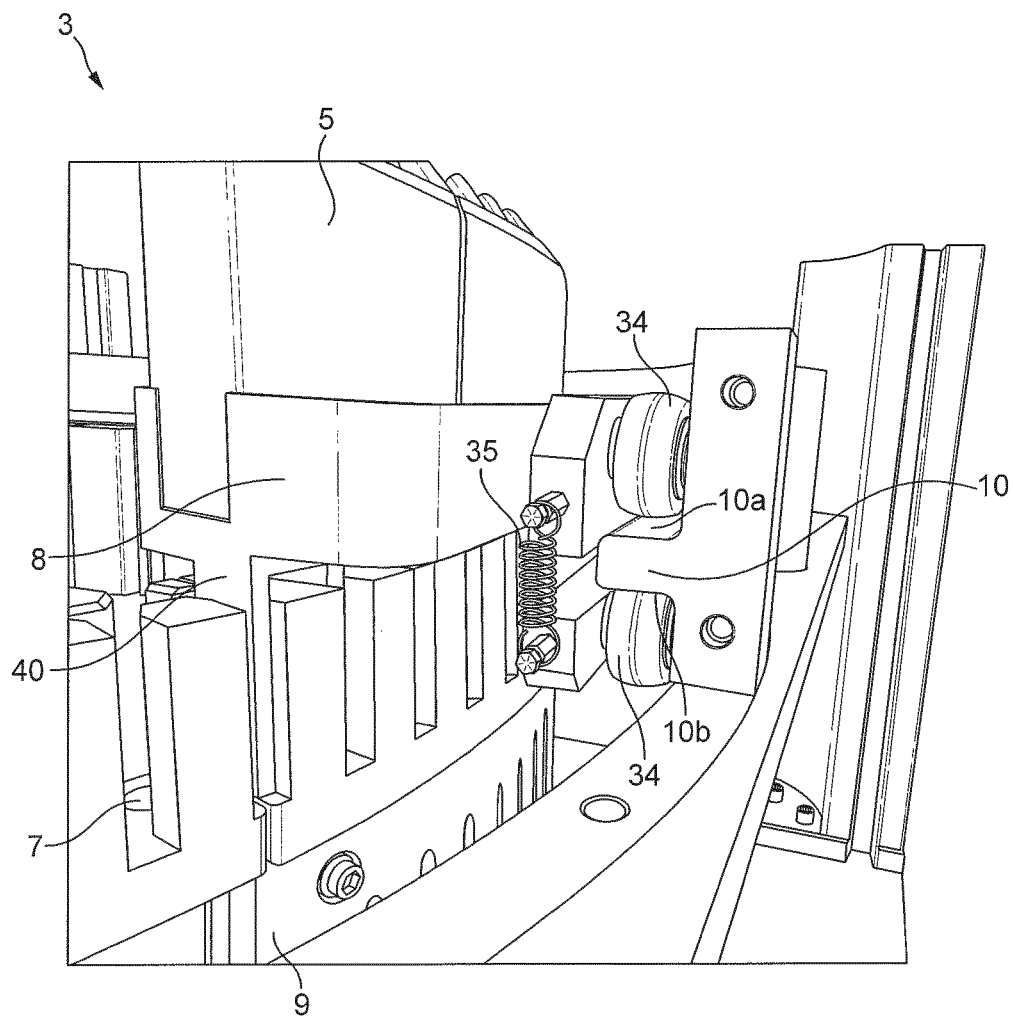
FIG. 7c shows the rotary device 3 with the outer cover and the hopper removed, exposing the carriers 8, inlets 5 and lower portions 9 of the channels 7.

FIGS. 7a to 7c show the mechanism by which the inlets 5 of the channels 7 are caused to reciprocate in the hopper (4, see FIG. 4) as the rotary device 3, including the drum 19, hopper (4, see FIG. 4) and channels 7, rotates. As illustrated, groups of inlets 5 are mounted on a carrier 8 that is caused to reciprocate. In FIGS. 7a to 7c the hopper has been removed so that the drum 19, channels 7 and inlets 5 are visible. Also, for clarity, in FIGS. 7a and 7c only show one carrier 8 with inlets 5, whereas the full feed unit would include several disposed around the circumference of the drum 19. Moreover, in FIG. 7b the carriers 8 and inlets 5 are not shown at all.

As previously explained, the inlets 5 are formed in groups of three (31, see FIG. 6a) and each group of three inlets 5 is attached to a carrier 8, as shown in FIGS. 7a and 7c. Each carrier carries three of the groups 31 shown in FIG. 6a, meaning, in this example, each carrier 31 carries nine inlets 5.

The carrier 8 is slidably mounted to the drum 19 so that the carrier 8 and inlets 5 can slide up and down in the reciprocal direction.

As shown in FIG. 7a, the carrier 8 to which the inlets 5 are attached has a cam follower 33 comprising two cam wheels 34 disposed one above the other and directed outwards to engage a cam track to that surrounds the drum 19. The cam wheels 34 are spaced apart and urged towards each other by a biasing means, such as an extension spring 35, to keep the cam wheels 34 in contact with the cam track 10.

FIG. 7b shows the cam track to that is mounted to the frame 18 such that it surrounds the drum 19 and the drum 19 rotates relative to the cam track 10. The cam track to has upper and lower cam surfaces 10a, 10b that are engaged by the two cam wheels 34 on the carrier 8 as the drum 19 rotates. The upper and lower cam surfaces 10a, 10b are equispaced along the cam track 10. The cam track to comprises a curved profile that acts to sequentially raise and lower the carriers 8 and inlets 5 as the drum 19 and carriers 8 rotate relative to the cam track 10.

As shown in FIG. 7c, the cam wheels 34 are disposed on opposing sides of the cam track to and the extension spring 35 acting between the two cam wheels 34 urges the cam wheels 34 into contact with the upper and lower surfaces 10a, 10b of the cam track 10 so that as the drum 19 rotates the cam wheels 34 follow the cam track to and cause the inlets 5 to reciprocate in the hopper (4, see FIG. 4) as per the profile of the cam track 10. The two cam wheels 34 act to push the carrier 8 up and down in response to inclinations in the cam track 10.

In another example, each carrier 8 may comprise a single cam wheel and the cam track may have opposing upper and lower surfaces with the cam wheel retained between the upper and lower surfaces.

In this example, as shown in FIG. 7b, the cam track to is provided with two ascending portions 36 separated by two descending portions 37 around its circumference, meaning the inlets 5 will reciprocate two times per revolution of the drum 19. FIG. 7b shows one ascending portion 36 and one descending portion 37 of the cam track 10. It will be appreciated that the cam track to may be provided with any number of inclined portions 36, 37 and may also include flat portions positioned between inclined portions 36, 37, as any incline or decline will cause reciprocation of the inlets 5 and therefore agitate the components in the hopper (4, see FIG. 4).

The profile of the cam track to is configured with a 'slow rise' and 'fast drop'. That is, as shown in FIG. 7b, the ascending portions 36 of the cam track 10 have a lower gradient than the descending portions 37 of the cam track 10, meaning that the inlets 5 will rise relatively slowly into the hopper (4, See FIG. 4) and fall back again more quickly as the drum 19 rotates in the direction indicated by arrow 38. The 'fast drop' gives additional agitation to the components in the hopper and means that the components are more likely to pass through the openings (6, see FIG. 6b) and into the channels 7.

It will be appreciated that the inlets 5 may be grouped in sizes more or fewer than three and the carrier 8 may be adapted to carry more or fewer than three groups of inlets 5. In some examples each individual inlet 5 is provided with a cam follower so that the inlets 5 reciprocate individually during rotation of the drum 19. In another example, all of the inlets 5 may be joined to the same carrier 8 so that they reciprocate together at the same time.

As shown in FIGS. 7a to 7c, the inlets 5 are attached to a carrier 8 which reciprocates up and down according to the cam track 10. Each channel 7 is formed in the inlet and in a lower portion 9 which does not reciprocate. Each inlet 5 is slidably mounted to a lower portion 9 of the channel 7 such that the lower portions 9 of the channels 7 rotate with the drum 19 but do not reciprocate relative to the hopper (4, see FIG. 4). Thus, the overall length of the channels 7 varies as the inlets 5 reciprocate.

As shown in FIG. 7b the lower portions 9 of the channels 7 formed in the drum 19 comprise a group of first protrusions 39 that extend in an upward direction, parallel to the rotational axis of the drum 19, in the direction of reciprocation. A part of each channel 7 is formed in the spaces between the first protrusions 39, and in particular defined by three adjacent first protrusions 39 that are positioned to retain the components in axial alignment.

As shown in FIG. 7c, each inlet 5 comprises a group of second protrusions 40 that extend downwards from the inlets 5 to slide in spaces between the first protrusions 39 such that a part of each channel 7 is defined between the second protrusions 40. In the overlapping region between the first and second protrusions 39, 40 the components are surrounded by the first and second protrusions 39, 40, which define a substantially complete circumference of the circular space of the channel 7 to retain the components in axial alignment.

Therefore, each channel 7 extends from an opening 6 in an inlet 5, between the first and second protrusions 39, 40, and through the lower portion 9. The channels 7 each have a circular cross-sectional shape along their length and the slidable connection is arranged such that the cross-sectional shape of the channels 7 remains consistent while the inlets 5 reciprocate, despite the length of the channel 7 changing.

In this particular example, the lower portion 9 of each channel 7 is formed by a groove in a circumferential face of the drum 3, and each groove is covered by a plate (not shown) that is attached to the drum 3.

Figure 8:
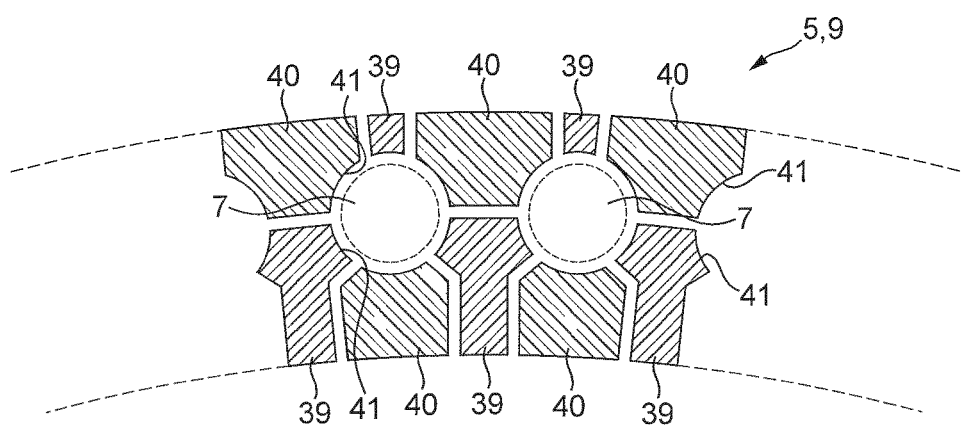
FIG. 8 shows a cross-section through the inlets 5 and lower portions 9 of some channels 7.

FIG. 8 shows a cross-section of the groups of first and second protrusions 39, 40 in the overlapping region. As shown, the protrusions 39, 40 comprise arcuate faces 41 that are alternately arranged around the circumference of each channel 7 such that, in combination, a substantially complete circular channel 7 is formed where the groups of first and second protrusions 39, 40 overlap. Where the protrusions 39, 40 do not overlap the arcuate faces 41 of the protrusions 39, 40 retain the components between three adjacent protrusions 39, 40 of the first or second group. Therefore, as the inlets 5 reciprocate and the amount of overlap between the protrusions 39, 40 varies, the channel 7 retains the components in axial alignment, either between the group of first protrusions 39, the group of second protrusions 40 or a combination of both.

The groups of first and second protrusions 39, 40 are able to slide over one another and are long enough to facilitate the reciprocal movement of the inlets 5. It will be appreciated that other arrangements of protrusions 39, 40 are envisaged, for example each channel 7 may be defined between any number of first and second protrusions 39, 40. Some of the protrusions, either the first group or the second group, have more than one arcuate surface 41 so that one of those protrusions 39, 40 can partially form two adjacent channels 7.

As shown in FIG. 7b, the pattern of the groups of first and second protrusions 39, 40 shown in FIG. 8 is repeated around the circumference of the drum 19, forming a plurality of adjacent channels 7.

The sliding protrusion arrangement described with reference to FIGS. 7b, 7c and 8 is advantageous because the diameter of the channel 7 remains constant and there are no steps formed in the side wall of the channel 7 on which a component may be caught, which could result in blockages and/or damaged components.

The apparatus described above with reference to FIGS. 4 to 8 receives randomly orientated components that are fed into the hopper 4 and pass into the channels 7 where they are stacked one on top of another in axial, end-to-end alignment as per steps S1 and S2 of the process described with reference to FIG. 3.

Figure 9:
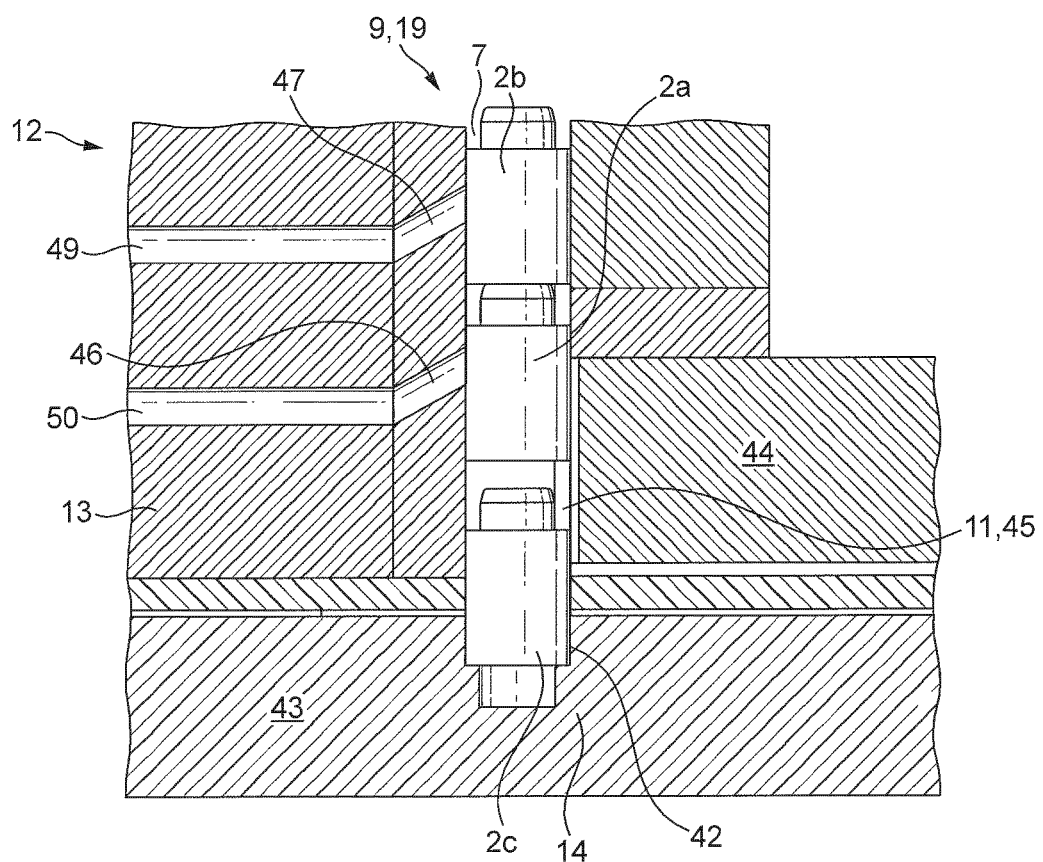
FIG. 9 shows a cross-section of an outlet 11 of a channel 7, showing a control gate 12 for dispensing components 2.

As previously explained, components are stacked one on top of another in the substantially vertical channels 7 in one of two orientations—with the protrusion (24, see FIG. 2) directed upwards or downwards. The components are then dispensed into a track 14 disposed beneath the channels 7 as per step S3 of the process described with reference to FIG. 3. FIG. 9 shows a cross-section of a lower portion 9 of a channel 7 that includes an outlet 11 and also shows the track 14 into which the components 2 are dispensed.

As shown, in this example the track 14 is formed of a groove 42 or channel or passage. The groove 42 is formed in the surface of a plate 43 and defines the path of the track 14 through the feed unit 1 along which the components 2 are pushed.

However, it will be appreciated that the track 14 may comprise a guide member that defines a path through the feed unit. For example, the guide member may comprise an edge or face, or a series of edges or faces, which guide components along a defined path as the components are pushed along the track 14. The guide member is stationary and as the pushers (21, see FIG. 13) push the components they are guided along the path by the guide member.

As will be described hereinafter, components 2 are individually dispensed into the track 14 from the channel 7 as the drum 19 rotates. In particular, one component is dispensed from each channel 7 into the same region of the track 14 during one rotation of the drum 19. Components 2 are received in the groove 42 of the track 14 in an upright orientation, i.e. with the longitudinal axis of the components substantially vertical. As shown in FIG. 9, in the region of the track 14 where the components 2 are dispensed from the channels 7 there is a retaining member 44 positioned adjacent to the outlet 11 to direct dispensed components into the groove 42 of the track 14. After the components have been dispensed they travel in a horizontal direction along the track 14, past the end of the retaining member 44 and can move radially away from the channels 7 through the side openings 45 formed at the outlets 11 of the channels.

Each channel 7 has a dispensing mechanism that comprises a control gate 12 formed of upper and lower suction holes 46, 47 provided in a side of the lower portion 9 of the channel 7. These suction holes 46, 47 are through-holes in the drum, and are positioned to retain the bottom two components 2a, 2b in the stack of components within the channel 7. The manifold 13 shown in FIG. 9 and to sequentially provides the suction holes 46, 47 with suction as the drum 19 rotates.

The upper and lower suction holes 46, 47, when provided with suction, pull the adjacent component 2a, 2b towards a side of the channel 7 and retain the component in that position. Therefore, when suction is applied, the lower suction hole 46 retains the bottommost component 2a and the upper suction hole 47 retains the next component 2b in the channel 7 and the components in the channel 7 above these two components are retained in the channel 7 by the holding force of the suction being applied to at least the second bottom component 2b.

FIG. 9 shows the suction holes retaining two components 2a, 2b at the bottom of the channel 7 and also shows a component 2c that has already been dispensed from the channel 7 into the grove 42 of the track 14.

The manifold 13, shown in FIG. 9 and to, is disposed in the centre of the drum 19 and is fixed such that it does not rotate with the drum 19. The suction holes 46, 47 extend to an inside face of the drum 19 against which an outer circumferential face 48 of the manifold 13 is sealably disposed. The circumferential face 48 of the manifold 13 is provided with upper and lower suction passages 49, 50 that are aligned with the upper and lower suction holes 47, 46 of the drum respectively. As the drum 19 rotates relative to the manifold 13 the upper and lower suction passages 49, 50 move into and out of alignment with the upper and lower suction holes 47, 46 in the drum 19. The suction passages 49, 50 are arranged so that, as the drum 19 rotates, the upper and lower suction holes 47, 46 are provided with either suction or no suction as the suction holes 46, 47 move into and out of alignment with the suction passages 49, 50. This arrangement dispenses components from the channels, as described with reference to FIG. 11.

Figure 11:
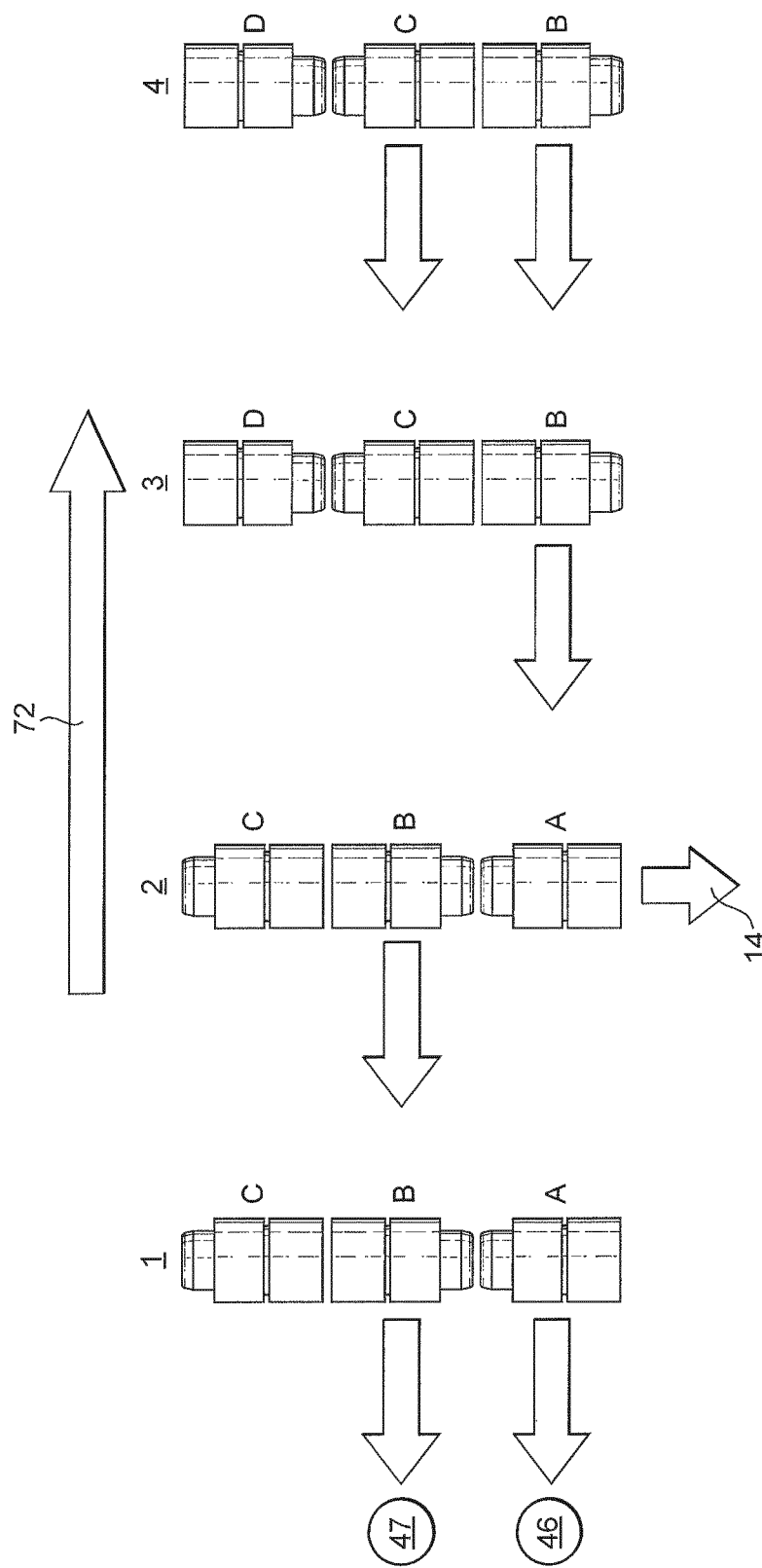
FIG. 11 shows a schematic diagram of the process performed by the control gate.

FIG. 11 shows four steps performed by the control gate 12 as the drum 19 rotates relative to the track 14 and manifold 13. Arrow 72 presents the direction of rotation of the drum 19 and channels 7, that is, the order in which the steps are performed.

The steps shown in FIG. 11 are explained below, with reference to FIG. 9 and to also:

Step 1—This shows the state of the control gate 12 during rotation of the drum 19 before a channel 7 reaches a position where a component 2 is dispensed. As shown, suction is applied to both the upper and lower suction holes 47, 46 by configuring the suction passages 49, 50 of the manifold 13 to be aligned with the suction holes 46, 47 in this part of the rotation of the drum 19. Therefore, suction is applied to the bottommost component A and the next component B so that the stack of components A, B, C is retained in the channel 7 and the weight of the stack of components A, B, C is supported by the suction.

Step 2—This shows the state of the control gate 12 as the channel 7 approaches the point at which a component should be dispensed into the track 14. In this position, the lower suction passage 50 closes so that suction is not applied to the lower suction hole 46 and the bottommost component A is released, allowing it to pass through the outlet 11 of the channel 7 and into the track 14, as shown in FIG. 9. The other components C are supported by the suction applied to the second bottom component B, disposed above the dispensed component A.

Step 3—This shows the state of the control gate 12 after a component A has been dispensed into the track 14. In this step, suction is re-applied to the lower suction hole 46 and closed on the upper suction hole 47 such that the stack of components B, C, D moves down one integer within the channel 7, ready to dispense the next component B.

Step 4—Finally, both suction passages 49, 50 are aligned with the suction holes 47, 46 to retain the components B, C, D in the channel 7 in the same manner as Step 1.

In this way, as the drum 19 rotates, each time a channel 7 passes over a dispensing region of the track 14 one component is dispensed from that channel 7 into the track 14. In other words, during one rotation of the drum every channel 7 will dispense one component into the same region of the track 14. Moreover, the upper suction hole 47 supports the stack of components while the bottommost component is dispensed from the channel 7.

In an alternative example, the control gate comprises one suction hole provided in each channel which retains the bottommost component of the stack. The suction passage in the manifold can be arranged to stop the suction being applied to the component for a time which is sufficient to release the bottommost component and catch the next component in the stack as the stack of components moves down within the channel.

Additionally, each channel 7 may be provided with a compressed air passage that is sequentially provided with a blast of compressed air by the manifold 13, which can be configured to receive and provide suction and compressed air. The compressed air can be arranged to urge the bottommost component out of the channel 7 as the suction from the lower suction hole 46 is released. Therefore, the component can be more quickly dispensed into the track 14. The compressed air may be replaced by a different compressed gas or pump to provide a positive gaseous flow into the channel 7.

Figure 10:
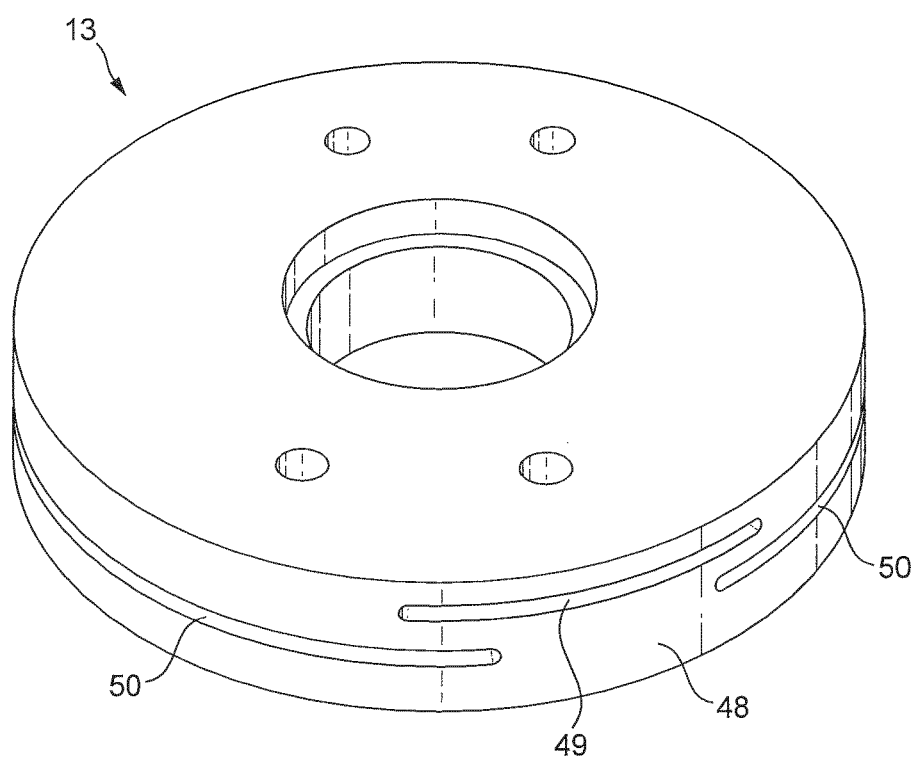
FIG. 10 shows the manifold 13 of the control gate.
Figure 12:
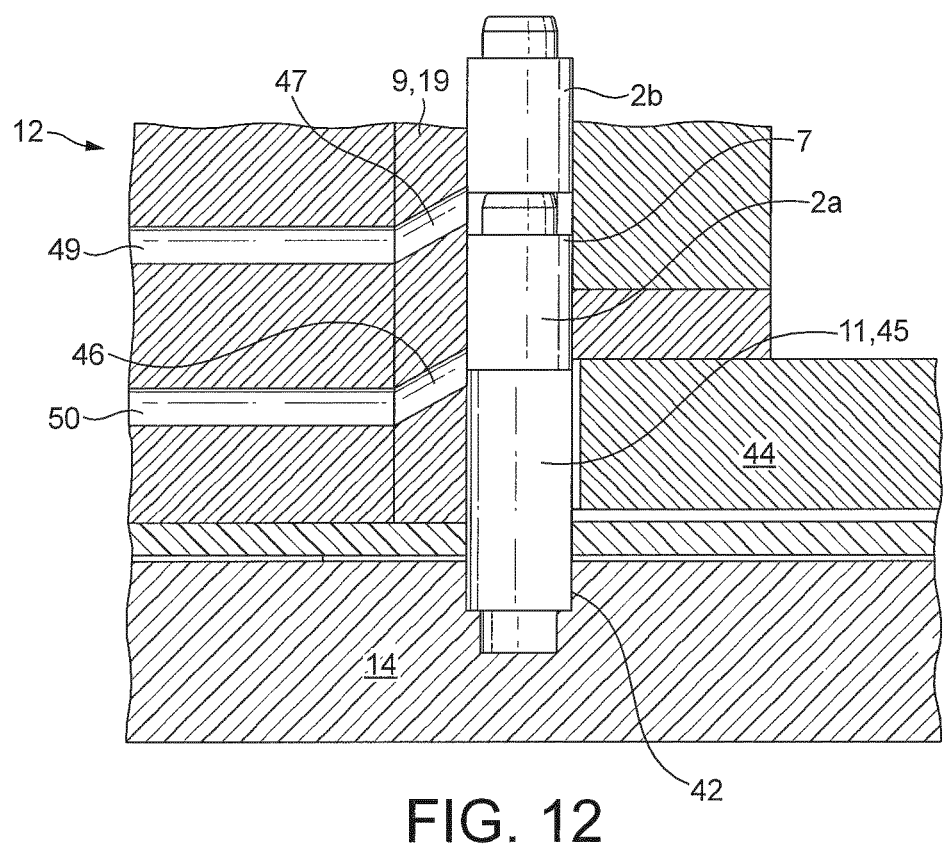
FIG. 12 shows a cross-section of an outlet 11 of a channel 7, showing an alternative control gate 12.

FIG. 12 shows an alternative control gate 12 that can be provided in the lower portion 9 of each channel 7 for dispensing components into the track 14, in a similar manner to that described with reference to FIGS. 9 to 11. In particular, the upper and lower holes 47, 46 of the example shown in FIG. 9 are provided with a gaseous flow, for example compressed air, as opposed to suction. The upper and lower holes 47, 46 are angled to direct the compressed air upwards into the channel 7 at an angle, such that the compressed air holds the components 2 in place and prevents them from falling out of the channel 7. The force provided by the compressed air is counteracted by the weight of the stack of components above and equilibrium can be found by adjusting the pressure of the air being provided to the manifold 13 and subsequently the channel 7.

As shown in FIG. 12, upper and lower holes 46, 47 are positioned to direct the compressed air towards the bottom of each component 2a, 2b and the sequence of applying and stopping the compressed air can be the same as described with reference to FIG. 11. In particular, the manifold 13 described with reference to FIGS. 9 to 11 can be adapted to sequentially provide the upper and lower holes 47, 46 with compressed air instead of suction.

In an alternative example, the control gate of each channel may comprise one hole that directs compressed air onto the bottommost component in the channel, thereby retaining the stack of components in the channel. The passage in the manifold can be arranged to stop the flow of compressed air into the channel for sufficient time to release the bottommost component and catch the next component in the stack as the stack of components moves down within the channel under gravity.

Additionally, each channel may be provided with a compressed air passage that is arranged to urge the bottommost component out of the channel as that component is released from the control gate. The compressed air passage can be sequentially provided with a blast of compressed air by the manifold. Therefore, the component can be more quickly dispensed into the track.

The rotary device 3 described with reference to FIGS. 4 to 12 can be considered to be a dispensing device that receives components in the hopper 4 and dispenses components into the stationary track 14.

Figure 13:
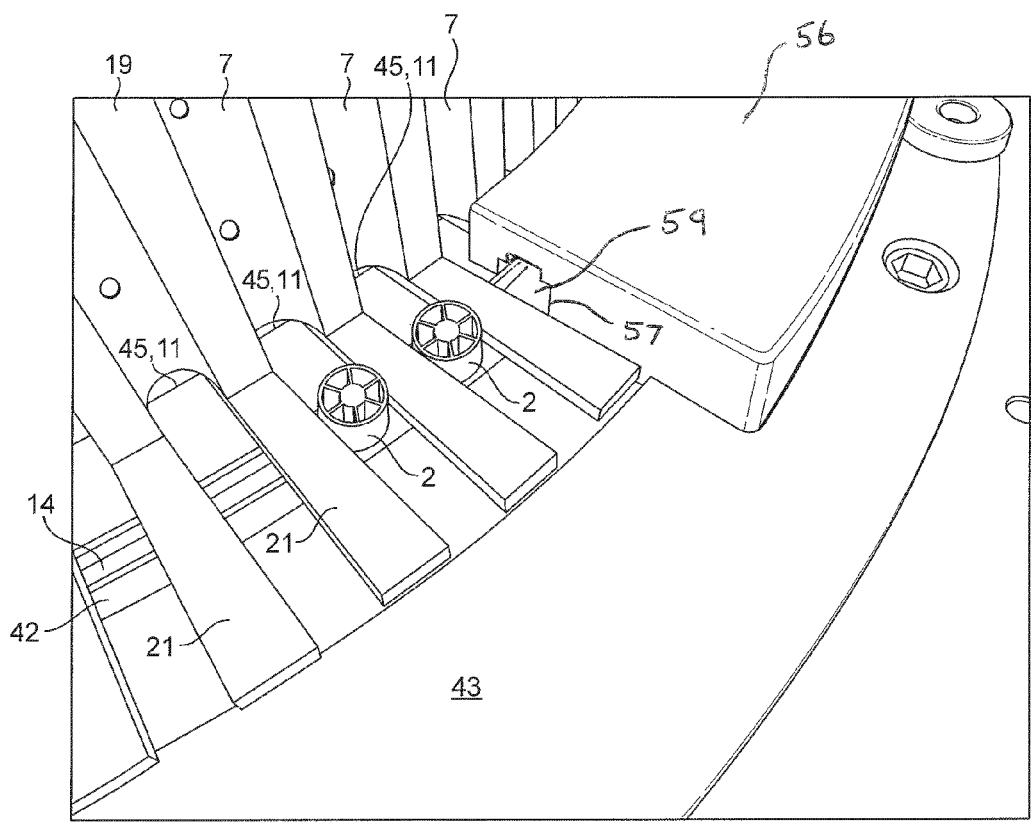
FIG. 13 shows the outlets 11 of some channels 7 and a track 14 into which the components 2 are dispensed.

FIG. 13 shows the outlets 11 of the channels 7 and the stationary track 14 into which the components 2 are dispensed. The outlet 11 of each channel 7 is formed of an open end and an outwards facing side opening 45 in the channel 7, which is also shown in FIG. 9, so that, once the bottom-most component has been dispensed into the track below the channel 7, that component can be guided radially outwards from the channel 11 to move the component away from the drum 19. FIG. 13 shows the components after they have been guided away from the outlets 11 in a radial direction.

As previously explained, in the region in which the components are dispensed into the track 14, the track 14 is formed of a groove 42 in an upper surface of a first plate 43 mounted below the drum 19 and a retaining member (44, see FIG. 9) is disposed to direct the components 2 into and along the track 14. In the dispensing region, the track 14 is disposed directly below the channels 7, such that the components 2 pass directly from the channels 7 into the track 14. The track 14 has a width that is slightly greater than the width of the components 2 so that the components 2 can easily enter into the track 14 and slide along the track 14.

As shown in FIG. 13, the drum 19 is also provided with a plurality of pushers 21, one associated with each channel 7, in between which the components 2 are received after they have been dispensed from a channel 7 into the track 14. The pushers 21 are attached to, and rotate with, the drum 19, so that the pushers 21 move relative to the track 14 and push the components 2 along the track 14. The pushers 21 are fixed in alignment with the channels 7 so that the components 2 are reliably dispensed from the channels 7 into the track 14 between a pair of pushers 21.

Each pusher 21 comprises a finger-like protrusion that extends across the track 14 in a radial direction with an elongate space formed between each pair of pushers 21. The components 2 are dispensed into the space between each pair of pushers 21 so that the position of each component 2 along the track 14 is defined by a pair of pushers 21—one in front and one behind. In this way, the pushers 21 also act to maintain a spacing between each pair of components 2 along the track 14.

The control gate 12 and pushers 21, which separate the components 2 along the track 14, mean that a single component 2 is dispensed into every space between a pair of pushers 21 and no empty spaces are left along the track 14. Therefore, components 2 are reliably delivered in a spaced arrangement to the transfer drum (22, see FIG. 1) and subsequently the smoking article assembly apparatus. This helps to ensure that no filters or smoking articles are assembled without the required components and also eliminates the need for a further buffer between the feed unit and the downstream smoking article assembly apparatus.

The rotary device 3, with the hopper 4, channels 7 and control gates 12, described with reference to FIGS. 4 to 12, forms a dispensing device which receives, buffers and then dispenses components 2 into the track 14 where the pushers 21 push them along the track 14 for output from the feed unit 1.

Figure 14:
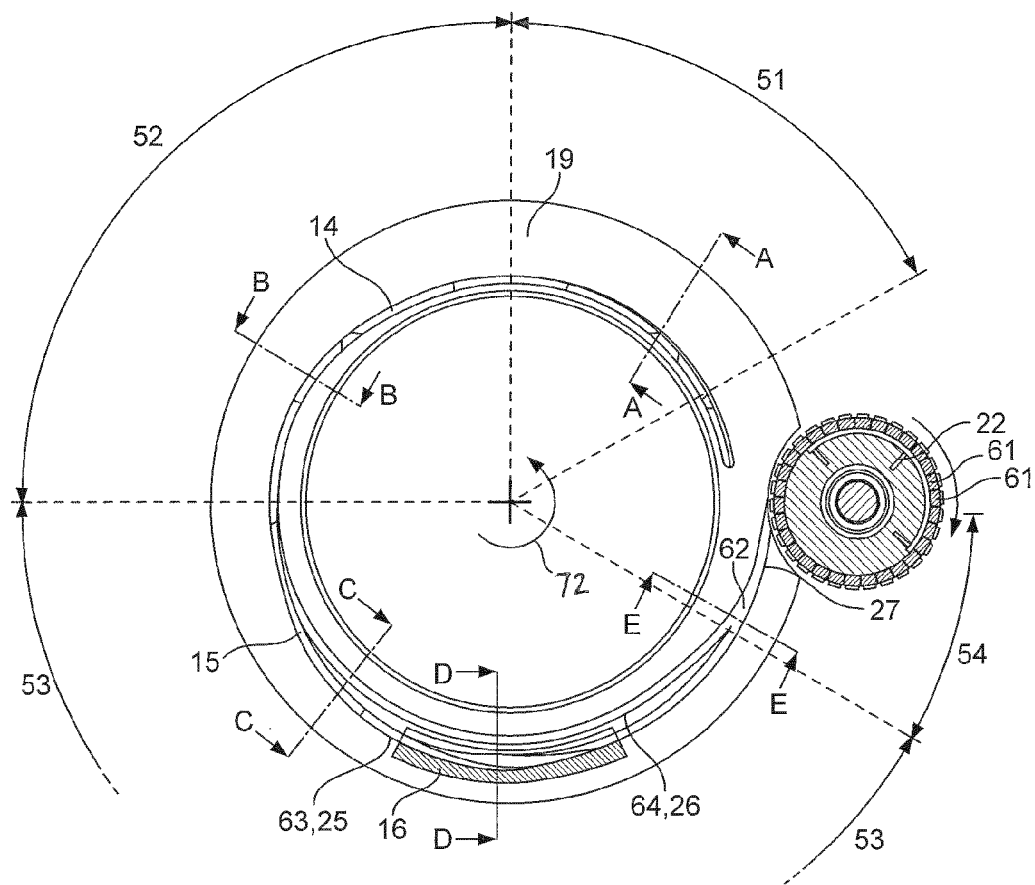
FIG. 14 shows a schematic diagram of the track 14.

FIG. 14 shows a schematic diagram of the stationary track 14 along which the components are pushed by the pushers (21, see FIG. 13) as the drum 19 rotates in the direction of arrow 72. The track 14 defines a path within the feed unit along which the components are pushed until they are transferred to subsequent apparatus. As previously described, the drum 19, including the channels, dispensing mechanism and pushers, is disposed above the track 14 and rotatably driven relative to the track 14.

As described with reference to FIG. 9, the track 14 may comprise a groove 42 in a surface of a plate 43 in which the components 2 are received between pushers 21, the groove 42 defining the path through the feed unit along which the components 2 are pushed. Alternatively, the path could be defined by any guide member, for example a single surface or edge that guides the components, or a plurality of surfaces or edges. Alternatively, the path may be defined by a channel, recess, angle or other shaped component that acts to direct the components along a defined path as they are pushed by the pushers.

As shown in FIG. 14, the track includes the following regions:

Region 51—the components are dispensed from the channels into the track within this region.

Radial movement region 52—the track guides the components radially away from the channels.

Sorting and orienting region 53—steps S4 to S6 described with reference to FIG. 3 are performed to sort and orientate the components.

Transfer region 54—components are guided onto a transfer drum 22 and exit the feed unit.

Figure 15A:
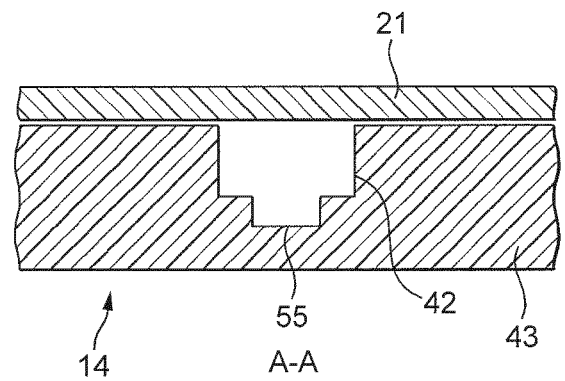
FIG. 15a shows cross-section A-A of the track 14, as indicated in FIG. 14.

FIG. 15a shows cross-section A-A of the region 51 of the track 14, as indicated in FIG. 14. The region 51 of the track 14 is formed of a groove 42 in the surface of a first plate 43. The groove 42 includes a recess 55 to receive the protrusion (24, see FIG. 2) of any components that are orientated with their protrusion directed downwards. Any components that are orientated with their protrusions directed upwards can also be received in the groove 42. Components within the track 14 protrude above the surface of the first plate 43. The pushers 21 extend across the track 14, above the first plate 43, such that components received in the track 14 are pushed along the track 14 by the pushers 21. Within the region 51 the width of the groove 42 may be wider so that components are more easily and reliably received in the track 14 as they are dispensed from the channels 7. The width of the track 7 then narrows to a width only marginally larger than the components 2 to allow the components 2 to smoothly move along the track 14 while also providing close positional control of the components 2.

Figure 15B:
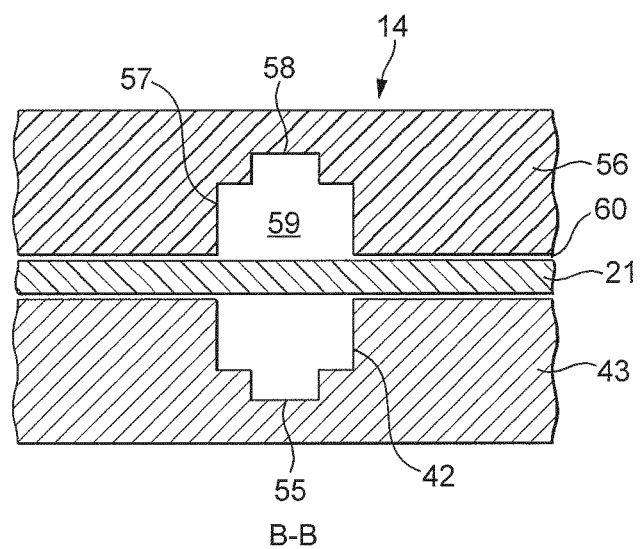
FIG. 15b shows cross-section B-B of the track 14, as indicated in FIG. 14.

FIG. 15b shows cross-section B-B, as indicated in FIG. 14, through the radial movement region 52 of the track 14. The radial movement region 52 of the track 14 is also shown in FIG. 13. The radial movement region 52 begins after the retaining member (44, see FIG. 9) of the region 51 finishes, meaning the components 2 are able to move sideways out of the side openings (45, see FIG. 9) and away from the channels 7. In this region 52, the track 14 additionally comprises a second plate 56 positioned opposite the first plate 43 and having a groove 57 in its lower surface such that the grooves 42, 57 of the first and second plates 43, 56 form a tunnel-shaped channel 59 through which the components are pushed. As shown in FIG. 15b, the grooves 42, 57 of both the first and second plates 43, 56 have recesses 55, 58 positioned to accommodate the protrusion (24, see FIG. 2) of the components that pass through this part of the track 14 in either the 'protrusion up' or 'protrusion down' orientation.

Also shown in FIG. 15b, a gap 60 is formed between the first and second plates 43, 56 so that the pushers 21 can extend across the track 12 between the first and second plates 43, 56. In this way, the pushers 21 extend through the middle of the track 14, approximately mid-way along the components, and push the components along the track 14 as the drum rotates. The track 14 substantially surrounds the components and they are further retained between the pushers 21 so that the components cannot turn or come out of alignment as they move along the track 14. The position of the components in this region of the track 14 is defined and controlled by the tunnel-shaped channel 59 and the pushers.

As shown in FIG. 14 and referring also to FIG. 13, in the radial movement region 52 of the track 14 the components are guided radially outwards, away from the outlets 11 of the channels 7 and the drum 19 in a radial direction. This occurs after the components have passed an end of the retaining member (44, see FIG. 9) in the region 51. Therefore, as the components are pushed around the track 14 from the region 51 the components move away from the channels and the second plate 56 is positioned such that when the components are sufficiently separated from the channels they enter the tunnel-shaped channel 59 formed between the first and second plates 43, 56. It will be appreciated that the second plate 56 is not provided in the region 51 as it would block the path of the components from the outlets 11 of the channels 7 into the track 14 (see FIG. 9).

The sorting and orienting region 53 of the track 14 divides the components into two streams according to their orientation, rotates one of the streams and then recombines the streams to form a single stream of uniformly orientated components for output from the feed unit. The transfer region 54 of the track 14 feeds the components onto a transfer drum 22 that receives the components in carriers or flutes 61 formed on a circumferential surface of the transfer drum 22 in a manner that would be known per se to a person skilled in the art.

As shown in FIG. 14, the sorting and orienting region 53 of the track 14 comprises a separator 15, a rotator 16 and a re-combiner 62, which perform steps S4, S5 and S6 described with reference to FIG. 3. The single stream of components that have been dispensed into the track 14 with the protrusion either directed upwards or downwards are separated into a first stream 25 and a second stream 26 according to their orientation by the separator 15. Next, one of the streams, in this case the first stream 25, passes through the rotator 16 that rotates each of those components to change their orientation. The first and second streams 25, 26 are then recombined by the re-combiner 62 to provide a single output 27 of uniformly orientated components. In this example, the rotator 16 rotates the components through 180 degrees, such that they are inverted, but it will be appreciated that other angles of rotation may be provided and both of the first and second streams 25, 26 may also be rotated.

Figure 16:
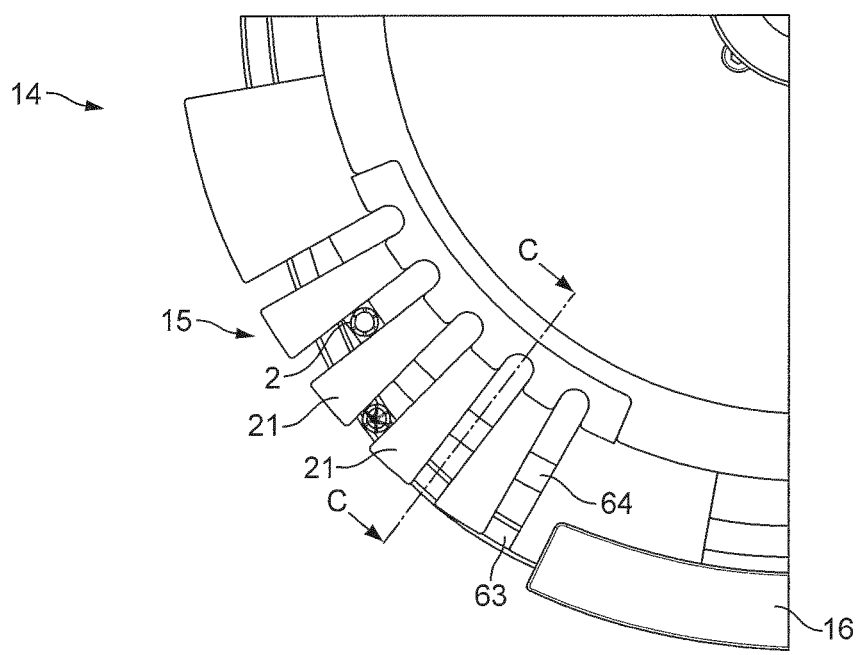
FIG. 16 shows a separator 15 of the track 14.

As shown in FIG. 16, the separator 15 comprises a 'Y'-shaped split track. In particular, the track 14 into which the components have been dispensed splits into first and second track portions 63, 64.

FIG. 15b shows cross-section B-B, as indicated in FIG. 14, and shows the shape of the track 14 prior to the separator 15. Here, the channel 59 of the track 14 surrounds the components that are received in the track 14 in either the protrusion up or protrusion down orientation. This is achieved by providing the first and second plates 43, 56 with recesses 55, 58 within the grooves 42, 57 adapted to allow the protrusions (24, see FIG. 2) of the components to pass along the track 14.

Figure 18A:
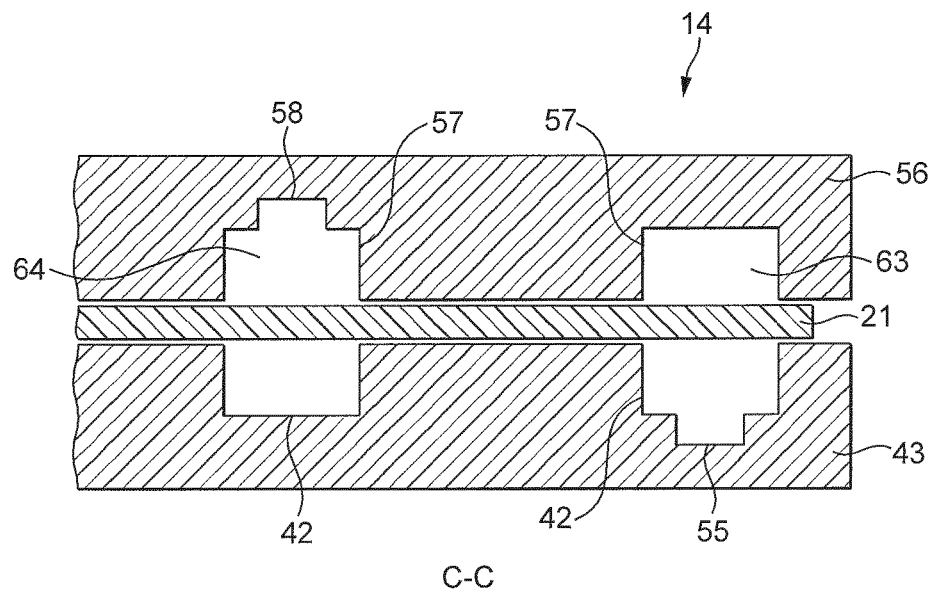
FIG. 18a shows cross-section C-C of the track 14, as indicated in FIG. 14.

FIG. 18a shows cross-section C-C, as indicated in FIGS. 14 and 16, which is a cross-section of the first and second track portions 63, 64 downstream of the separator 15. As shown, the recess 58 in the second track portion 64 is arranged such that the second track portion 64 only accepts components with the protrusion directed upwards and the recess 55 of the first track portion 63 is arranged such that the first track portion 63 only accepts components with the protrusion directed downwards. In particular, the second track portion 64 is only provided with a recess 58 in the second plate 56 and the first track portion 63 is only provided with a recess 55 in the first plate 43. Therefore, as the components pass through the 'Y'-shaped split they will be guided into either the first or second track portion by the protrusions of the components being guided by the recesses 55, 58 in the track 14. In this way, as the pushers 21 push the components along the track 14, they are separated into first and second streams 25, 26 in the first and second track portions 63, 64 according to their orientation.

As shown in FIG. 16, the first and second track portions 63, 64 move apart from one another in a radial direction, so that as components 2 pass into one of the first and second track portions 63, 64 they move radially between the pushers 21 which each extend across the first and second track portions 63, 64. Therefore, one component 2 is retained between each pair of pushers 21 regardless of which of the first and second track portions 63, 64 the component 2 is directed along.

Referring again to FIG. 14, the first track portion 63, which accepts components with their protrusions directed downwards, comprises a rotator 16 that rotates the first stream of components 25 to match the orientation of the second stream of components 26 in the second track portion 64. This rotator 16 is formed of a helically shaped component that forms a part of the first track portion 63.

In particular, in the region of the rotator 16 the grooves 42, 57 that form the track 14 in the first track portion 63 are shaped to define a rotated track portion so that components passing along the first track portion 63 are rotated. In this example, the components are rotated through 180 degrees into an orientation with their protrusions directed upwards.

Figure 18B:
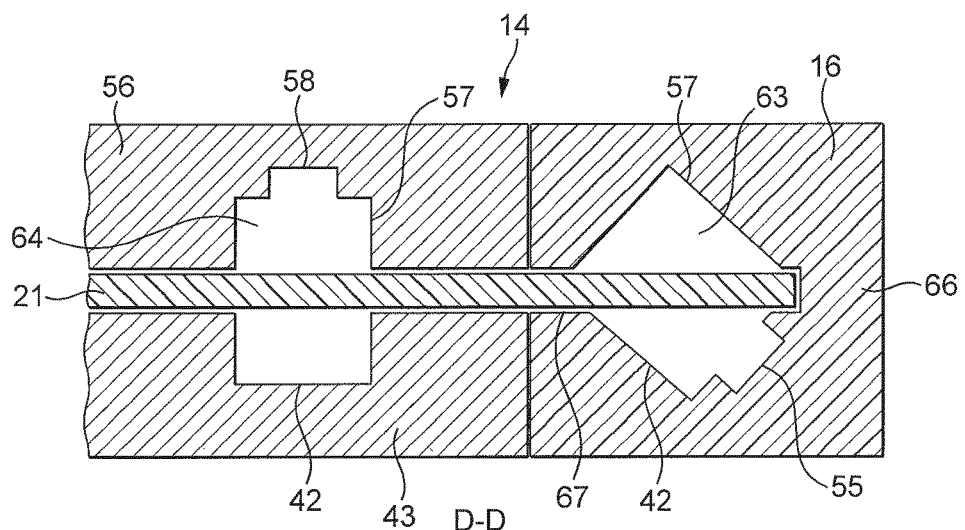
FIG. 18b shows cross-section D-D of the track 14, as indicated in FIG. 14.

FIG. 18b shows cross-section D-D, indicated on FIG. 14, through the first and second track portions 63, 64 in the region of the rotator 16. As shown in FIG. 18b, the track 14 is formed by the grooves 42, 57 in the first and second plates 43, 57 that define an outline shape of the components. This shape is rotated along the rotator 16 so that the components passing along the track 14 are rotated as they are pushed through the rotator 16 by the pushers 21. The centre of rotation of the rotated part of the track 14 is at the mid-point between the first and second plates 43, 56 so that the components remain between, and are pushed by, the pushers 21 throughout the rotation of the components by the rotator 16.

Figure 17:
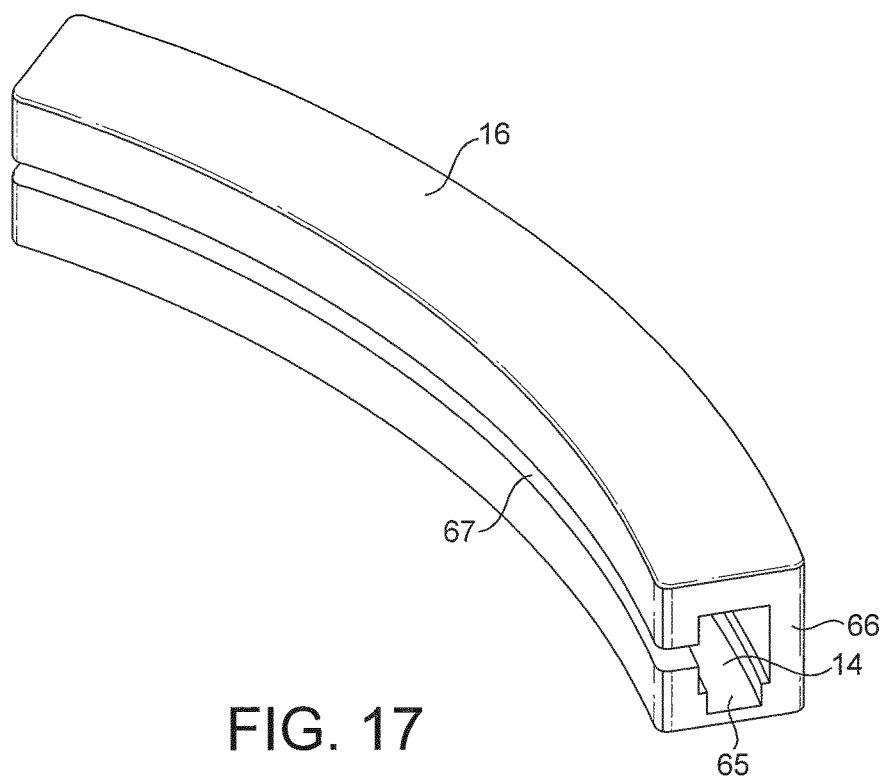
FIG. 17 shows a rotator 16 of the track 14.

FIG. 17 shows the rotator 16 separately from the track 14. As shown, the inlet 65 of the rotator 16 is shaped to receive components with their protrusions directed downwards. The outlet of the rotator 16, not visible in FIG. 17, has an opposite orientation, with the protrusion directed upwards. Intermediate the inlet and outlet the track 14 maintains the same shape, but is rotated through 180 degrees to form the rotated part of the track 14.

Also shown in FIGS. 17 and 18b, the first and second plates 43, 57 of the rotator 16 are connected by a side wall 66 on the outer side of the rotator 16, such that the rotator 16 is formed of one piece. A gap or slot 67 is provided between the first and second plates 43, 56 on the inner side of the rotator 16 to allow the pushers 21 to extend across the first track portion 63 formed within the rotator 16. The side wall 66 improves the accuracy and reliability of the rotator 16 as the rotated track 14 can be formed on the inside face of the side wall 66 as appropriate to support the components through a greater portion of their rotation and prevent the components becoming jammed or losing orientation. Moreover, the shape of the track 14 formed by the upper and lower grooves 42, 56 can be more accurately defined and maintained resulting in more accurate and reliable rotation of the components.

Figure 18C:
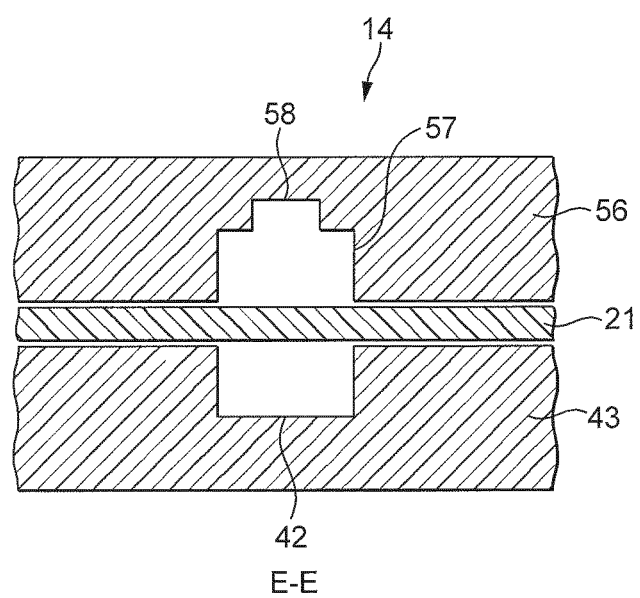
FIG. 18c shows cross-section E-E of the track 14, as indicated in FIG. 14.

Once components have been directed into either the first or second track portion 63, 64, and after the components in the first track portion 63 have been rotated, the first and second streams of components 25, 26 are recombined, as shown in FIG. 14. The re-combiner 62 is similar to the 'Y'-shaped separator 15 described with reference to FIGS. 14, 15b and 18a, except that in this instance the first and second track portions 63, 64 lead into a single output and the protrusions of the components are all facing the same direction, in this case upwards. Therefore, the first and second track portions immediately upstream of the re-combiner 62 both have a recess 58 formed in the groove 57 of the second plate 56. FIG. 18c shows cross-section E-E, as indicated in FIG. 14. This cross-section is taken through the track 14, after the re-combiner 62, and, as shown, the track 14 is formed to accept components having uniform orientation, with the protrusion directed upwards.

It will be appreciated that the track 14 may alternatively be arranged to provide a stream of components being orientated with their protrusions directed downwards. In this case, the track 14, including the rotator 16, can be rearranged to rotate the second stream of components 26, with their protrusions directed upwards. In other examples, a rotator 16 could be provided on both of the first and second track portions 63, 64, such that both streams of components 25, 26 are rotated to achieve uniform orientation. For example, the first stream of components 25 could be rotated through 90 degrees in a clockwise direction and the second stream of components 26 could be 25 rotated through 90 degrees in an anticlockwise direction, such that the components have uniform orientation with their protrusions directed sideways.

As each component has been pushed through the sorting and orienting region 53 of the track 14 in a space between a pair of pushers 21, when the two streams of components 25, 26 are recombined the components remain between the same pair of pushers 21 so that the components cannot clash and the circumferential spacing of the components around the track 14 is maintained. This consistent spacing is advantageous for transferring the components quickly and accurately to the transfer drum without the need for a buffer disposed between the feed unit and any downstream apparatus.

As previously described, the stream of components with uniform orientation is transferred to subsequent apparatus by means of a transfer drum 22, shown in FIG. 14. The transfer drum 22 is driven in an opposite direction to the rotary device 3 and the rotational speed is configured such that successive receiving pockets 61 on the transfer drum 22 are aligned with successive components between the pushers 21 as the rotary device 3 and the transfer drum 22 rotate. This can be achieved by driving the transfer drum 22 with the same drive mechanism as the rotary device 3, for example by a toothed belt or gear arrangement, to ensure accurate synchronisation between the rotary device 3 and the transfer drum 22.

Figure 19:
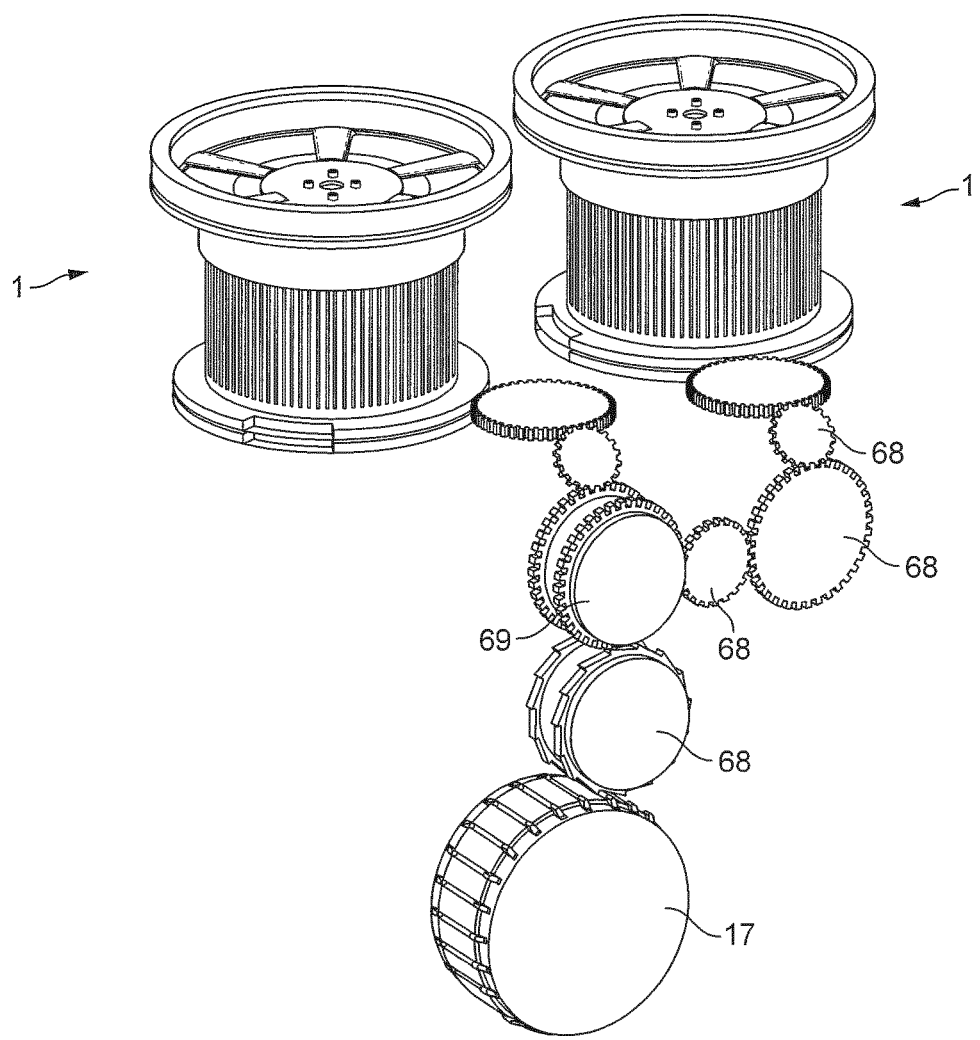
FIG. 19 shows a schematic layout of a smoking article assembly apparatus, including two feed units 1.

FIG. 19 shows a schematic example of how the feed unit 1, described with reference to FIGS. 1 to 18, may be arranged to provide filter components to smoking article assembly apparatus. As shown, two feed units 1 may be arranged to transfer filter components, via one or more handling drums 68, to an assembly drum 17. The handling drums 68 may be configured to create an appropriate axial or circumferential spacing of the filter components. An intermediate combining drum 69, further described with reference to FIG. 20a, receives a stream of components from each of the two feed units 1 and conveys them to an assembly drum 17, described with reference to FIG. 20b.

Figure 20A:
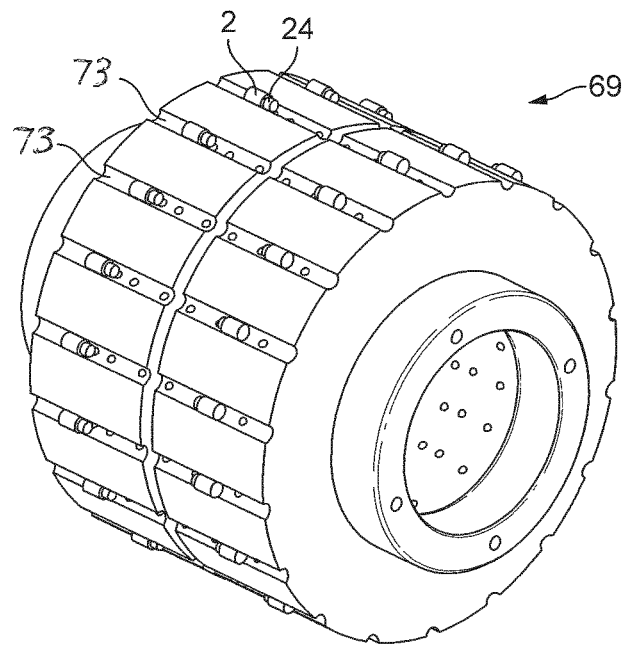
FIG. 20a shows a combining drum 69 of the smoking article assembly apparatus; and, FIG. 20b shows an assembly drum 17 of the smoking article assembly apparatus.
Figure 20B:
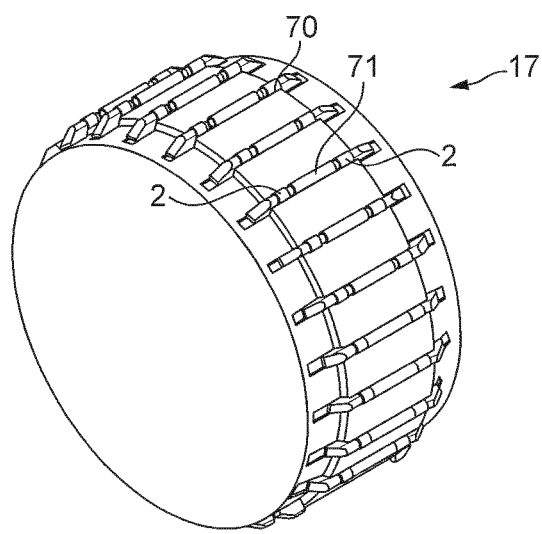

FIG. 20a shows an example of the combining drum 69 onto which the filter components 2 are fed. The combining drum 69 has a plurality of flutes 73, each being provided with two filter components 2 that are spaced from each other with each protrusion 24 facing the other component 2 in the same flute 73. FIG. 20b shows the assembly drum 17 which receives the components 2 in the same format as they are positioned on the combining drum. A filter rod 71, for example an acetate rod is positioned in each flute 70, between the filter components 2, and the two filter components 2 can be pushed towards the rod 71 such that the protrusions 24 engage openings in the ends of the filter rod 71 to form a double length filter.

This assembled filter can be transferred to subsequent wrapping operations, combined with tobacco rods, and cut to form two smoking articles in a manner that will be known per se by a person skilled in the art. Each part of the feed unit, for example the drum, channels, pushers and transfer wheel, may be synchronised to the downstream apparatus, for example the wrapping and cutting apparatus. In this way, components within the feed unit are in register with the downstream apparatus and can be directly fed from the feed unit into the downstream apparatus.

Two feed units 1 are utilised in the example of FIG. 19 so that the smoking article assembly apparatus can be provided with two oppositely directed streams of filter components 2 for manufacturing smoking articles in a two-up configuration. However, it will be appreciated that, depending on the downstream assembly apparatus and the requirements for the smoking article, any number of feed units may be provided.

It will be appreciated that the feed unit described above may be modified to feed alternative components having a different shape to that described with reference to FIG. 2. For example, the feed unit may be adapted to feed other components for tobacco industry products. The feed unit may alternatively be adapted to feed cylindrical components without a protrusion, for example conventional filter components. In this case, the track does not require the sorting and orienting region. Alternatively, the feed unit may be adapted to feed spherical components, for example flavour capsules for insertion into a smoking article filter. In this case, no orientation is required but the accuracy and feed rate provided by the feed unit may be advantageous.

Moreover, it will be appreciated that the feed unit may be utilised to feed different types of components in other industries and products. For example, the feed unit may be adapted to feed components for electronic products, pharmaceuticals or other consumer goods. Similarly to as described above, the feed unit can be adapted to feed components having different shapes and different requirements for orientation. The feed unit may be adapted to feed products into packaging apparatus.

The channels and the track and other parts of the feed unit can be adapted to receive and process components that have different shapes. For example, the groove(s) that forms the track may be shaped to match an asymmetry in the components and the channels may be shaped to provide some initial alignment similar to the axial alignment described with reference to the filter component of FIG. 2.

According to various embodiments of the invention, components move in a stream along a path with their relative positions maintained. That is, once the components enter the track the order of the components within the stream is maintained and the spacing between each component is constant. The positions of the components within the stream can be registered or synchronised to the transfer wheel or the downstream apparatus, such that the components can be fed directly into the downstream apparatus.

This gives rise to speed advantages because each of the components is positively driven through the feed unit and along the exit path in a fixed order, with fixed speed and spacing, which is advantageous for transferring the components onto the transfer drum and subsequent apparatus. That is, after passing through an opening 6 and into a channel the position of each component within the feed unit may be registered to a position in the track and on the transfer wheel 22 and other downstream apparatus, meaning that further alignment of components to wheels/drums is not required. This allows the feed unit to run at high speed without loss of accuracy or control over the position of each component, and without the need for a buffer positioned between the feed unit and any downstream apparatus.

Moreover, the orientation of each component can be corrected as it is driven through the feed unit. This is in contrast to many known feed units where incorrectly orientated components are ejected back to the beginning of the process, therefore reducing the maximum attainable throughput of the feed unit.

Furthermore, the stacking of the components within the channels provides a buffer of components prior to dispensing those components into the track. Therefore, it is ensured that every channel dispenses one component per rotation of the drum, meaning the track and the transfer wheel are provided with a component in each space. This reduces the possibility that gaps or spaces may be left without a component, which may result in a malformed assembled component further downstream.

As used herein, the term "smoking article" includes smokeable products such as cigarettes, cigars and cigarillos whether based on tobacco, tobacco derivatives, expanded tobacco, reconstituted tobacco or tobacco substitutes and also heat-not-burn products. The smoking article may be provided with a filter for the gaseous flow drawn by the smoker.

A tobacco industry product refers to any item made in, or sold by the tobacco industry, typically including a) cigarettes, cigarillos, cigars, tobacco for pipes or for roll-your-own cigarettes, (whether based on tobacco, tobacco derivatives, expanded tobacco, reconstituted tobacco or tobacco substitutes); b) non-smoking products incorporating tobacco, tobacco derivatives, expanded tobacco, reconstituted tobacco or tobacco substitutes such as snuff, snus, hard tobacco, and heat-not-burn products; and c) other nicotine-delivery systems such as inhalers, lozenges and gum. This list is not intended to be exclusive, but merely illustrates a range of products which are made and sold in the tobacco industry.

In order to address various issues and advance the art, the entirety of this disclosure shows by way of illustration various embodiments in which the claimed invention(s) may be practiced and provide for a superior feed unit. The advantages and features of the disclosure are of a representative sample of embodiments only, and are not exhaustive and/or exclusive. They are presented only to assist in understanding and teach the claimed features. It is to be understood that advantages, embodiments, examples, functions, features, structures, and/or other aspects of the disclosure are not to be considered limitations on the disclosure as defined by the claims or limitations on equivalents to the claims, and that other embodiments may be utilised and modifications may be made without departing from the scope and/or spirit of the disclosure. Various embodiments may suitably comprise, consist of, or consist essentially of, various combinations of the disclosed elements, components, features, parts, steps, means, etc. In addition, the disclosure includes other inventions not presently claimed, but which may be claimed in future.

The invention claimed is:

1. A feed unit comprising:
a rotary device, adapted to rotate, the rotary device having a hopper that defines a supply region, and one or more channels adapted to receive components from the supply region such that the components are stacked one on top of another within each channel;
wherein each channel has an inlet and an outlet through which components pass for output from the feed unit; and,
wherein one of the inlet and the hopper is configured to reciprocate relative to the other to agitate the components in the supply region so that components pass into the channel.

2. The feed unit of claim 1, wherein each inlet is configured to reciprocate relative to the hopper.

3. The feed unit of claim 2, wherein each inlet is configured to reciprocate relative to the hopper and the corresponding outlet.

4. The feed unit of claim 3, comprising protrusions arranged to slide relative to each other to permit each inlet to reciprocate relative to each outlet.

5. The feed unit of claim 4, wherein the protrusions overlap and are arranged to maintain the cross-sectional shape of each channel during reciprocation of the inlet relative to the outlet.

6. The feed unit of claim 1, further comprising a cam track to cause reciprocation of each inlet as the rotary device rotates.

7. The feed unit of claim 6, wherein the cam track is configured to cause each inlet to move towards the hopper at a lower speed than each inlet moves away from the hopper.

8. The feed unit of claim 1, wherein each inlet comprises a funnel-shaped opening.

9. The feed unit of claim 8, wherein the distance between opposing sides of each opening is less than a length of said component.

10. The feed unit of claim 1, wherein each inlet comprises a wall that divides that inlet from an adjacent inlet, and wherein the wall extends into the hopper.

11. The feed unit of claim 1, wherein the hopper comprises walls inclined towards each inlet.

12. The feed unit of claim 1, wherein the feed unit further comprises a guide member that defines a path along which components are pushed for output from the feed unit after passing through a channel.

13. The feed unit of claim 1, wherein the hopper comprises inclined sides.

14. The feed unit of claim 13, wherein the hopper comprises an inner side wall and an outer side wall, the inner side wall and the outer side wall being inclined towards an annular space in which the inlets of the channels are disposed.

15. The feed unit of claim 1, wherein the one or more channels extend from the bottom of the hopper.

16. The feed unit of claim 1, wherein the inlet moves into the supply region as one of the inlet and the hopper reciprocates relative to the other.

17. The feed unit of claim 1, wherein the rotary device, including the hopper and the one or more channels, rotates about a single axis.

18. A method of feeding components to assembly apparatus, comprising supplying components to a supply region of a hopper of a rotary device having one or more channels with an inlet, rotating the rotary device, and reciprocating one of the inlet or the hopper relative to the other to agitate components in the supply region such that components pass into channels and are stacked one on top of another within each channel before passing through outlets for output to said assembly apparatus.

19. A method of assembling an article, comprising the method of claim 18 and further comprising combining each of said components with one or more further components to form an article.

20. An article assembled using the method of claim 19.

* * * * *